US009019142B2

(12) United States Patent
Hiraoka et al.

(10) Patent No.: US 9,019,142 B2
(45) Date of Patent: Apr. 28, 2015

(54) SOLID-STATE IMAGING DEVICE, IMAGING SYSTEM, AND METHOD FOR DRIVING SOLID-STATE IMAGING DEVICE

(71) Applicant: Panasonic Corporation, Kadoma-shi, Osaka (JP)

(72) Inventors: Toshiaki Hiraoka, Osaka (JP); Kenichi Shimomura, Hyogo (JP); Yutaka Abe, Osaka (JP); Yusuke Shimizu, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 241 days.

(21) Appl. No.: 13/665,327

(22) Filed: Oct. 31, 2012

(65) Prior Publication Data

US 2013/0120622 A1    May 16, 2013

Related U.S. Application Data

(63) Continuation of application No. PCT/JP2010/007357, filed on Dec. 20, 2010.

(30) Foreign Application Priority Data

May 14, 2010    (JP) ................................. 2010-111851

(51) Int. Cl.
*H03M 1/56*    (2006.01)
*H04N 5/335*    (2011.01) *H04N 5/374*
(2011.01)    *H04N 5/378*
(2011.01)    *H03M 1/14*
(2006.01)    *H03M 1/12*
(2006.01)

(52) U.S. Cl.
CPC ............... *H04N 5/335* (2013.01); *H04N 5/374* (2013.01); *H04N 5/378* (2013.01); *H03M 1/123* (2013.01); *H03M 1/144* (2013.01); *H03M 1/56* (2013.01)

(58) Field of Classification Search
CPC ....... H03M 1/123; H03M 1/56; H03M 1/144; H04N 5/373; H04N 5/335
USPC .................. 341/155, 144, 169, 156, 118, 120
See application file for complete search history.

(56) References Cited

U.S. PATENT DOCUMENTS 8,421,891 B2 *  4/2013  Morikawa et al. ............ 348/294
8,749,420 B2 *  6/2014  Takahashi et al. ............ 341/155

(Continued)

FOREIGN PATENT DOCUMENTS

| JP | 2009-038726 A | 2/2009 |
| JP | 2009-038781 A | 2/2009 |
| JP | 2010-087544 A | 4/2010 |

OTHER PUBLICATIONS

International Search Report issued in International Application No. PCT/JP2010/007357 issued on Feb. 15, 2011.

*Primary Examiner* — Peguy Jean Pierre
(74) *Attorney, Agent, or Firm* — McDermott Will & Emery LLP

(57) ABSTRACT

In a solid-state imaging device which includes column analog-to-digital conversion circuits (ADCs) for converting pixel signals output from pixels into digital signals, each of the column ADCs includes a comparator which outputs a result of voltage comparison (comparison result signal) between the voltage of the pixel signal and an analog ramp voltage; a column counter which counts a column counter clock signal, which is either a clock signal or a phase-shifted clock signal, and stores a value represented by upper bits of a count value at a time of change in the comparison result signal; and a first latch unit which stores a value represented by lower bits of the count value. A second latch unit stores the value stored in the first latch unit.

12 Claims, 29 Drawing Sheets

(56) References Cited

U.S. PATENT DOCUMENTS

| | | | |
|---|---|---|---|
| 8,773,552 B2* | 7/2014 | Egawa | 348/229.1 |
| 2005/0242849 A1 | 11/2005 | Muramatsu et al. | |
| 2009/0009641 A1* | 1/2009 | Asayama et al. | 348/294 |
| 2009/0026352 A1 | 1/2009 | Shimomura et al. | |
| 2009/0040352 A1 | 2/2009 | Kawaguchi | |
| 2010/0079634 A1 | 4/2010 | Higuchi | |
| 2013/0068931 A1* | 3/2013 | Iwaki et al. | 250/208.1 |

* cited by examiner

LATCH TRUTH TABLE

| Clk | Reset | D | $Q_n$ |
|---|---|---|---|
| H | H | H | H |
| H | H | L | L |
| L | H | x | $Q_{n-1}$ |
| x | L | x | L |

PHASE SHIFT CODE FOR p = 2

BINARY VALUE (DECIMAL REPRESENTATION) :
PHASE SHIFT CODE VALUE

0 : 00
1 : 01
2 : 11
3 : 10

OUTPUT WAVEFORMS OF PHASE SHIFT CODE
GENERATOR FOR p = 2

PS [1]
PS [0]
CLK

PHASE SHIFT CODE FOR p = 4

BINARY VALUE (DECIMAL REPRESENTATION) :
PHASE SHIFT CODE VALUE

0 : 0000
1 : 0001
2 : 0011
3 : 0111
4 : 1111
5 : 1110
6 : 1100
7 : 1000

OUTPUT WAVEFORMS OF PHASE SHIFT CODE
GENERATOR FOR p = 4

PS [3]
PS [2]
PS [1]
PS [0]
CLK

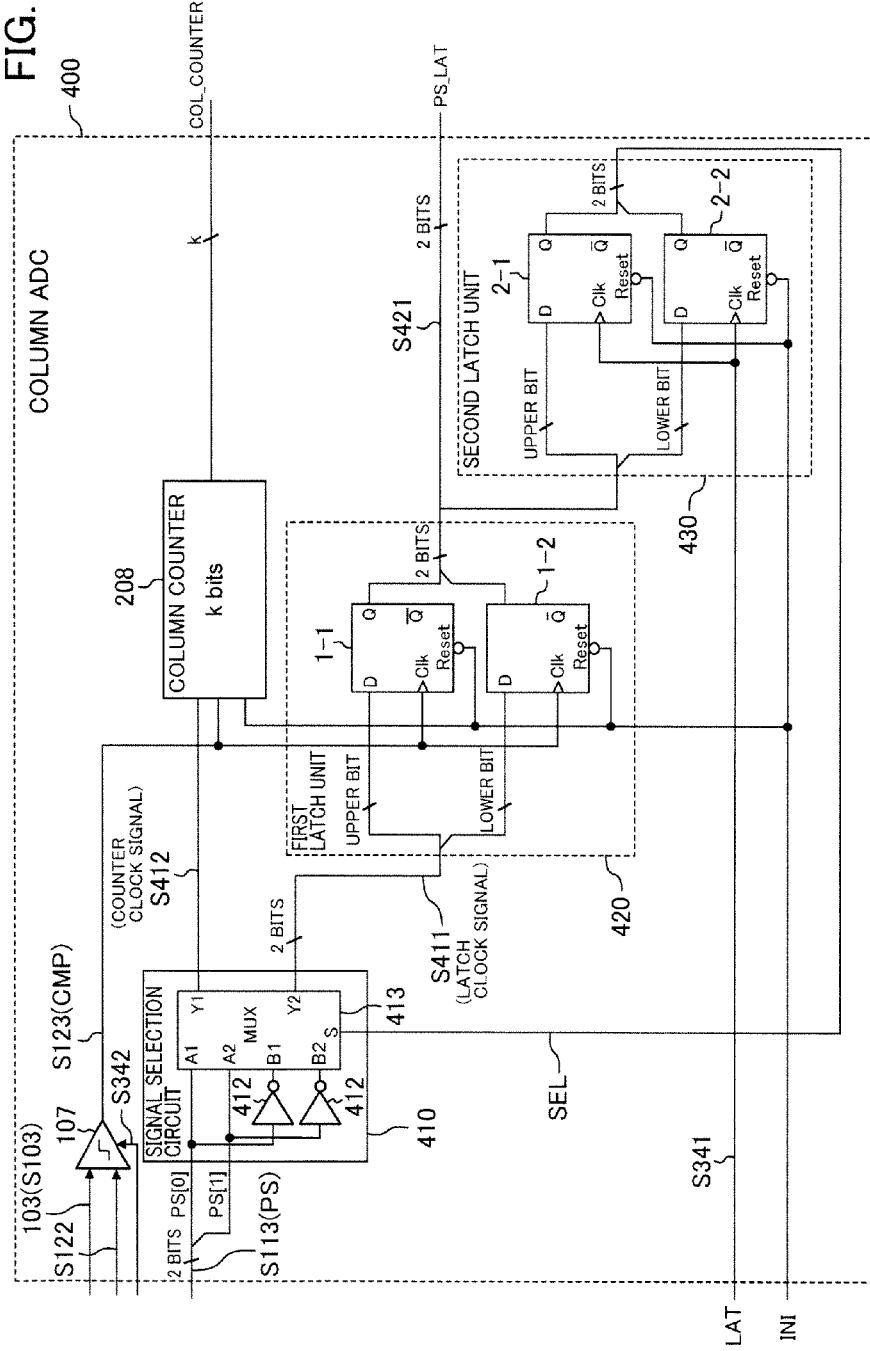

FIG.14

RELATIONAL TABLE OF SELECTION SIGNAL FOR
SELECTOR AND INPUT/OUTPUT SIGNALS

| S | Y1 | Y2[1] | Y2[0] |
|---|----|-------|-------|
| 0 | A1 | A1 | B2 |
| 1 | B2 | B2 | B1 |
| 3 | B1 | B1 | A2 |
| 2 | A2 | A2 | A1 |

EXAMPLE OF PHASE SHIFT CODE-TO-BINARY CONVERTER FOR P = 2

EXAMPLE OF PHASE SHIFT CODE-TO-BINARY CONVERTER FOR P = 4

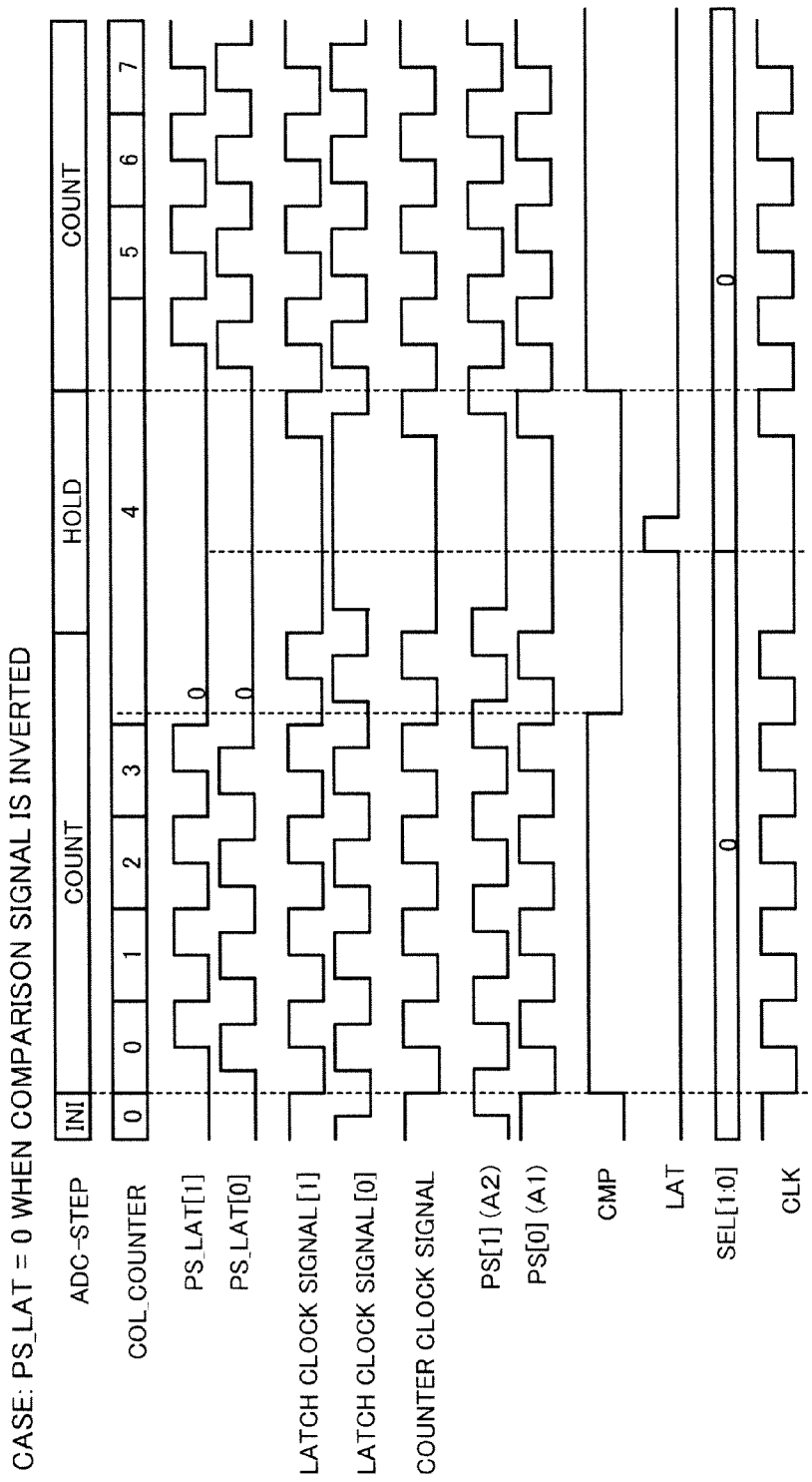

FIG.22

RELATIONAL TABLE OF INPUT/OUTPUT SIGNALS OF
SIGNAL SELECTION CIRCUIT FOR m = 2

| S' | S | Y1 | Y2[1] | Y2[0] |
|---|---|---|---|---|
| 1 | 0 | A1 | A1 | B2 |
| 1 | 1 | B2 | B2 | B1 |
| 1 | 3 | B1 | B1 | A2 |
| 1 | 2 | A2 | A2 | A1 |
| 0 | 0 | A2 | B2 | A1 |
| 0 | 1 | B1 | A1 | A2 |
| 0 | 3 | B2 | A2 | B1 |
| 0 | 2 | A1 | B1 | B2 |

FIG.23

RELATIONAL TABLE OF INPUT/OUTPUT SIGNALS OF SIGNAL
SELECTION CIRCUIT FOR m = 4, WHEN S' = H LEVEL (COUNT-UP)

| S  | Y1 | Y2[3] | Y2[2] | Y2[1] | Y2[0] |
|----|----|-------|-------|-------|-------|
| 0  | A1 | A1    | B4    | B3    | B2    |
| 1  | B4 | B4    | B3    | B2    | B1    |
| 3  | B3 | B3    | B2    | B1    | A4    |
| 5  | B2 | B2    | B1    | A4    | A3    |
| 15 | B1 | B1    | A4    | A3    | A2    |
| 14 | A4 | A4    | A3    | A2    | A1    |
| 12 | A3 | A3    | A2    | A1    | B4    |
| 8  | A2 | A2    | A1    | B4    | B3    |

FIG.24

RELATIONAL TABLE OF INPUT/OUTPUT SIGNALS OF SIGNAL
SELECTION CIRCUIT FOR m = 4, WHEN S' = L LEVEL (COUNT-DOWN)

| S | Y1 | Y2[3] | Y2[2] | Y2[1] | Y2[0] |
|---|----|-------|-------|-------|-------|
| 0 | A2 | B2 | B3 | B4 | A1 |
| 1 | A3 | B3 | B4 | A1 | A2 |
| 3 | A4 | B4 | A1 | A2 | A3 |
| 5 | B1 | A1 | A2 | A3 | A4 |
| 15 | B2 | A2 | A3 | A4 | B1 |
| 14 | B3 | A3 | A4 | B1 | B2 |
| 12 | B4 | A4 | B1 | B2 | B3 |
| 8 | A1 | B1 | B2 | B3 | B4 |

SOLID-STATE IMAGING DEVICE, IMAGING SYSTEM, AND METHOD FOR DRIVING SOLID-STATE IMAGING DEVICE

CROSS-REFERENCE TO RELATED APPLICATION

This is a continuation of PCT International Application PCT/JP2010/007357 filed on Dec. 20, 2010, which claims priority to Japanese Patent Application No. 2010-111851 filed on May 14, 2010. The disclosures of these applications including the specifications, the drawings, and the claims are hereby incorporated by reference in its entirety.

BACKGROUND

The present disclosure relates to solid-state imaging devices, imaging systems, and method for driving solid-state imaging devices having sensing elements for measuring physical quantities with respect to visible rays, electromagnetic waves, alpha rays, beta rays, etc.

In addition to sensors using charge-coupled devices (CCDs) (hereinafter referred to as "CCD sensors") which prevailed in image sensors, image sensors using metal oxide semiconductors (MOSs) (hereinafter referred to as "MOS sensors") which are fabricated using a standard process used for logic large scale integrated circuits (LSIs) have been widely distributed in the market today. Unlike CCD sensors, a MOS sensor allows a variety of analog and digital circuits to be integrated on a same substrate with a pixel array. A CCD sensor can generate a digital output signal only after the pixel array is coupled with an individual chip having an analog-to-digital (hereinafter "AD") conversion function, such as an analog front-end processor (hereinafter "AFE") specialized for an analog signal amplification function and an AD conversion function, or a digital signal processor (hereinafter "DSP") having an AFE function. In contrast, MOS sensors in which a pixel array and an AD conversion circuit (hereinafter "ADC") are integrated on a same chip are already commercially available.

Various conversion techniques have been proposed for ADCs installed in MOS sensors, including a pipeline AD conversion technique, which is widely used in AFEs, a column-parallel AD conversion technique, which performs an AD conversion operation on a line of pixel data concurrently and in parallel, and a technique which performs an AD conversion operation on all the pixel data concurrently and in parallel.

There is also a demand for such ADCs to operate at a higher speed and with higher accuracy. One example of achieving a higher speed and higher accuracy is a solid-state imaging device installed in an imaging device such as a digital camera, in which a ramp ADC for converting an analog pixel signal into a digital signal is provided in every one or more pixel columns, a column counter provided in each of the ramp ADCs stores upper bits of the digital signal, and a clock signal is supplied to a latch so that lower bits are stored therein, thereby achieving high-speed, high accuracy AD conversion while preventing an increase of clock frequency (see, e.g., Japanese Patent Publication No. 2009-038726 (Patent Document 1)).

SUMMARY

However, if digitized pixel signals are added up in the vertical direction of the image sensor (digital vertical pixel addition), the circuit size of the image sensor may increase as described below. That is, it is expected that the configurations shown in FIGS. 1, 5, etc. of Patent Document 1 causes multiple AD conversion operations to be continuously performed without resetting the count value stored in the column ADC. Thus, in such a case, whereas the value stored in the counter (the upper bits) in the results of the multiple AD conversion operations can be automatically added up, the ADC requires as many lower-bit latches as needed for the number of repetitions of an AD conversion operation. For example, if m is 2 in the configuration of FIG. 5, then one AD conversion operation requires latches for only two bits; three addition operations require latches for six bits.

Moreover, if, as shown in FIGS. 7 and 8 of Patent Document 1, an up/down counter is provided and correlated double sampling is performed, the ADC requires as many latch circuits for count-down and as many latch circuits for count-up as the number of pixel addition operations. If, in the example of Patent Document 1, three pixel addition operations for m=2 require latches for 12 bits. Such a configuration leads not only to an increase in size of the hardware of the latch circuit unit, but also to an increase in the number of signal lines and/or the read frequency for reading the AD conversion results, and accordingly may eventually lead to degradation in image quality due to an increase in power consumption and/or heat generation.

The present invention has been made in view of the foregoing problems, and thus it is an object of the present invention to achieve a solid-state imaging device which provides high image quality and high-speed processing while preventing an increase in circuit size even when the number of pixels, the frame rate, the conversion bit width, etc. are increased.

In order to solve the foregoing problems, an embodiment of the present invention provides a solid-state imaging device which includes a plurality of sensing elements arranged in a matrix format for measuring physical quantities, and a plurality of column analog-to-digital conversion circuits (ADCs) for converting signals output from the sensing elements into digital signals, where each of the column ADCs includes a comparator configured to output a comparison result signal which indicates a result of voltage comparison between a voltage of a signal output from each of the sensing elements and an analog ramp voltage generated from a reference clock signal, a column counter configured to count a column counter clock signal, which is either the reference clock signal or a phase-shifted reference clock signal, and to store a value represented by upper bits of a count value at a time of change in the comparison result signal, a first latch unit configured to store a latch clock signal which represents a value represented by lower bits of the count value, and a second latch unit configured to store a value corresponding to the value stored in the first latch unit.

With such a configuration, the value represented by lower bits of the count value is stored in the second latch unit at a time of change in the comparison result signal. Thus, as with the case of digital vertical pixel addition for example, when a next signal is input continuously, and a counting operation is started (restarted) with the value stored in the column counter, the state of the latch clock signal when the comparison result signal is inverted can be reproduced.

As described above, according to the present invention, a change in the comparison result signal causes no loss of the value stored in the first latch unit, thereby enabling a counting operation to be restarted in the column counter. Accordingly, even when the number of pixels, the frame rate, the conversion bit width, etc. are increased, high image quality and high-speed processing can be achieved while preventing an increase in circuit size.

BRIEF DESCRIPTION OF THE DRAWINGS

FIG. 13 is a block diagram illustrating in more detail a configuration of the column ADCs of the second embodiment.

FIG. 14 is a table showing a relationship between the value of the selection signal and the values output from the respective output terminals.

FIG. 16 is a timing diagram of when the value of PS_LAT is 0.

FIG. 22 is a table showing a relationship between the values of the signals input to the switching terminals of the signal selection circuit and input terminals coupled to the respective output terminals when m=2 by way of example.

FIG. 23 is a table showing a relationship between the value of the signal input to a switching terminal of the signal selection circuit and input terminals coupled to the respective output terminals.

FIG. 24 is a table showing a relationship between the value of the signal input to a switching terminal of the signal selection circuit and input terminals coupled to the respective output terminals.

DETAILED DESCRIPTION

Figure 1:
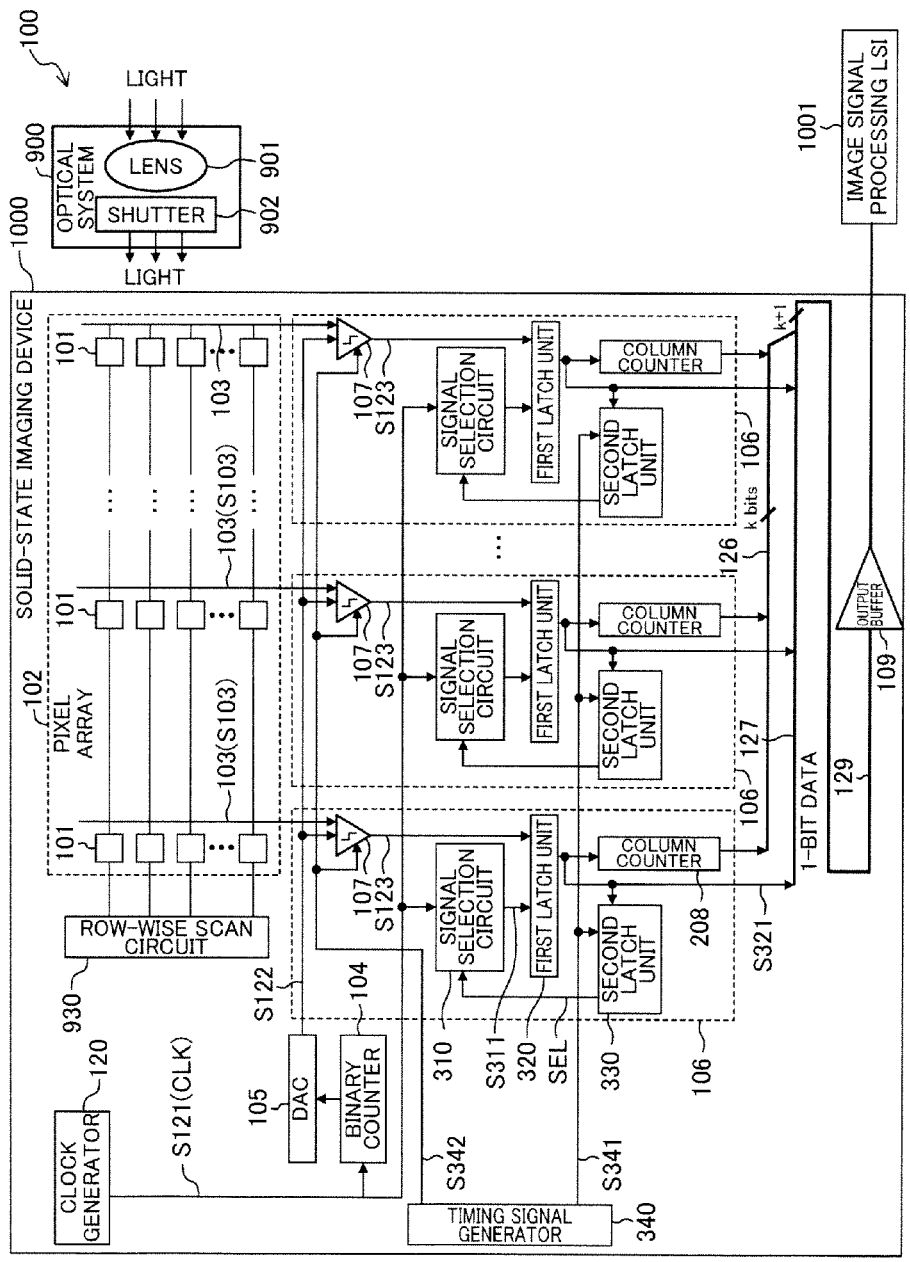
FIG. 1 is a block diagram illustrating a configuration of an imaging system according to the first embodiment of the present disclosure.

Example embodiments of the present disclosure will be described below with reference to the drawings. It is to be understood that the disclosed embodiments are illustrative in nature, and are not intended to limit the scope of the invention, application of the invention, or use of the invention. The components indicated by the same reference characters in the example embodiments operate similarly, and therefore the duplicative explanation is omitted.

First Embodiment

FIG. 1 is a block diagram illustrating a configuration of an imaging system 100 according to the first embodiment of the present disclosure. As shown in FIG. 1, the imaging system 100 includes an optical system 900, a solid-state imaging device 1000, and an image signal processing LSI 1001 (image signal processor). Note that the solid-state imaging device of each embodiment described below performs a so-called correlated double sampling (CDS) operation in an analog domain using a sample and hold (S/H) capacitor etc. In such a CDS operation, a reset level read from a pixel is subtracted from the signal level read from that pixel as an offset. Here, the description of such a CDS operation is omitted for purposes of facilitating an understanding.

Optical System 900

The optical system 900 includes a lens 901 and a mechanical shutter 902. The lens 901 collects light (e.g., visible light)

from an object, and forms an image on an imaging region of the solid-state imaging device 1000. The mechanical shutter 902 is disposed on an optical path between the lens 901 and the solid-state imaging device 1000, and controls the amount of light directed to the imaging region.

Image Signal Processing LSI 1001

The image signal processing LSI 1001 is an external LSI which performs various signal processing (image processing) on digital data (described later) output from the solid-state imaging device 1000.

Solid-State Imaging Device 1000

The solid-state imaging device 1000 includes a pixel array 102, column ADCs 106, output signal buses 126, 127, and 129, a clock generator 120, a binary counter 104, a digital-to-analog converter (DAC) 105 (abbreviated to DAC in FIG. 1), an output buffer 109, a timing signal generator 340, and a row-wise scan circuit 930.

The pixel array 102 (sensing element array) includes a plurality of pixels 101 arranged in a matrix format. Here, each of the pixel 101 is a unit element including, as needed, a device structure for reading a signal generated by photoelectric conversion, such as, for example, a photosensitive element including a photodiode and photogate, a photoelectric conversion film using amorphous silicon, and an organic photoelectric conversion film, as well as a structure allowing an initialization operation. Such a pixel 101 is an example of the sensing element of the present disclosure, and the pixel array 102 is an example of the sensing element array of the present disclosure.

Each of the column ADCs 106 is provided corresponding to one or more columns of the pixels 101. Each of the column ADCs 106 converts analog signals output from corresponding pixels 101 into digital signals, and stores the digital signals. FIG. 1 shows an example in which each of the column ADCs 106 is provided corresponding to each column. The configuration of the column ADCs 106 will be described in detail later. Note that the solid-state imaging device 1000 also includes column-wise scan units (not shown) for controlling output operations of the digital signals generated by, and stored in, the column ADCs 106.

The output signal buses 126, 127, and 129 are output signal buses, which transmit the digital signals output from the column ADCs 106. The output signal bus 126 is k-bit width (k is a positive integer), and the output signal bus 127 is one-bit width. The output signal buses 126 and 127 are coupled together to the output signal bus 129, which is (k+1)-bit width, so that the output signal bus 126 carries the upper bits, and the output signal bus 127 carries the least significant bit. The output signal bus 129 is coupled to the output buffer 109. The output of the output buffer 109 is, as described later, (k+1)-bit width digital data. The output of the output buffer 109 is coupled to the image signal processing LSI 1001.

The clock generator 120 supplies a clock signal S121 (reference clock signal) to the binary counter 104, and to the column ADCs 106. As described below, the clock signal S121 is a counter clock signal and a latch clock signal.

The binary counter 104 counts the clock signal S121, and provides a count value (binary value) to the DAC 105.

The DAC 105 generates an analog ramp voltage S122 (triangular wave) based on the binary value input from the binary counter 104. The analog ramp voltage S122 is input to the column ADCs 106 (more specifically, comparators 107, which will be described later).

The timing signal generator 340 undertakes switching of operation modes of the solid-state imaging device 1000, providing control of the clock generator 120, control of reading signals from the pixels 101, and control of the column ADCs 106. The timing signal generator 340 generates two signals for controlling the column ADCs 106: a latch control clock signal S341 (LAT) and a count start signal S342. Note that FIG. 1 does not show control signals from the timing signal generator 340 to the row-wise scan circuit 930 and to the clock generator 120.

The row-wise scan circuit 930 performs scanning to read signals from the pixels 101 on a row-by-row basis.

Configuration of Column ADC 106

Figure 2:
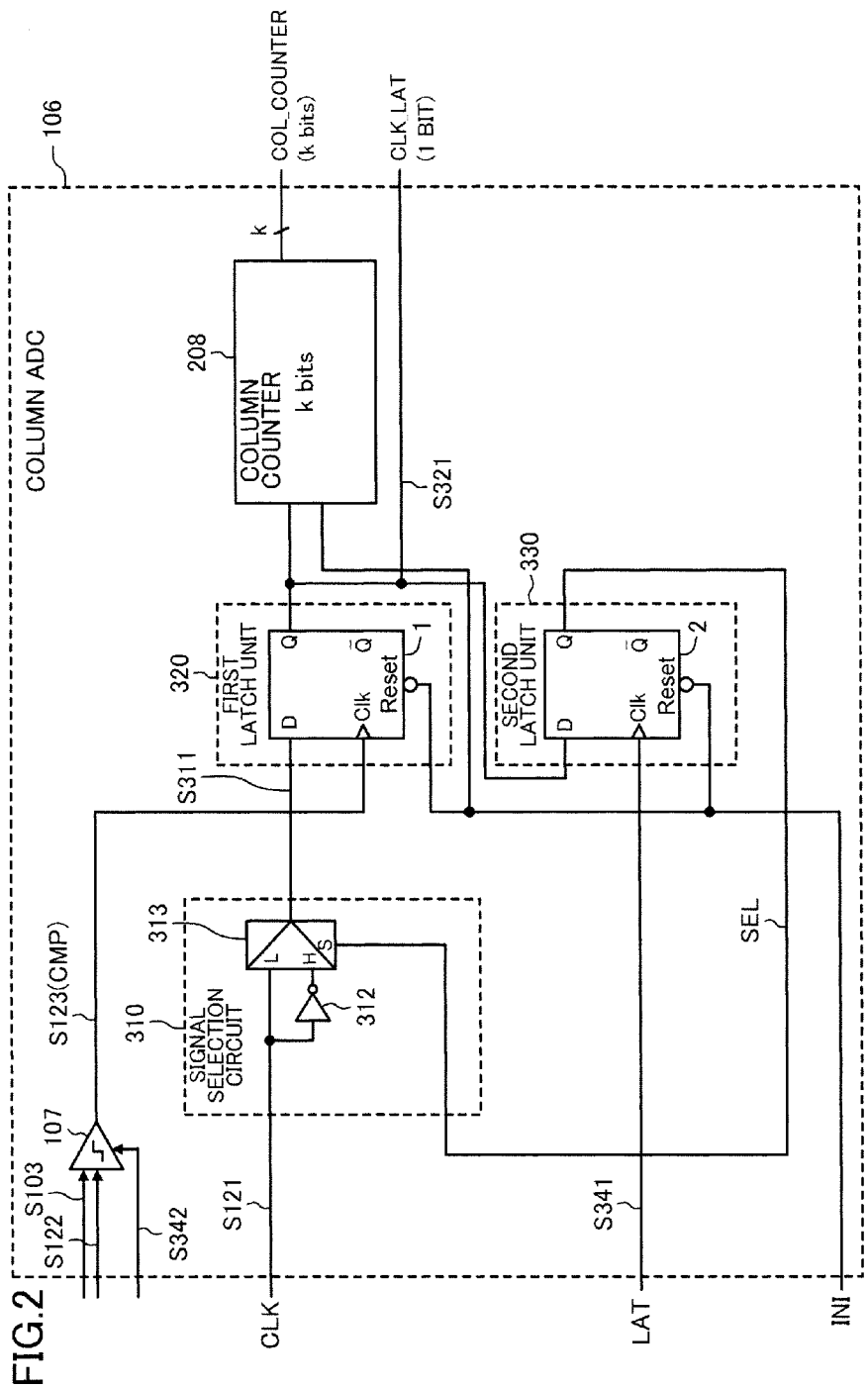
FIG. 2 is a block diagram illustrating in more detail a configuration of the column ADCs of the first embodiment.

FIG. 2 is a block diagram illustrating in more detail a configuration of the column ADCs 106 of the first embodiment. Each of the column ADCs 106 includes a comparator 107, a signal selection circuit 310, a first latch unit 320, a second latch unit 330, and a column counter 208.

Comparator 107

The comparator 107 compares signals (pixel signals S103) from the pixels 101 with a reference voltage, and outputs comparison results. To this end, as shown in FIGS. 1 and 2, one of the input portions of the comparator 107 is coupled with a read signal line 103 of the corresponding column, and receives the pixel signals S103 through the read signal line 103. The other one of the input portions of the comparator 107 receives the analog ramp voltage S122 generated by the DAC 105 as the reference potential. The comparator 107 also receives the count start signal S342 from the timing signal generator 340. The count start signal S342 sets the output of the comparator 107 to 1'b1 at the start of counting. Here, 1'b1 denotes that a one-bit signal is at a high logic level (H level).

Column Counter 208

The column counter 208 counts a column counter clock signal, which is either the clock signal S121 or a phase-shifted clock signal S121, and stores a value represented by upper bits of the count value at the time of change in the comparison result signal S123. In this example, the column counter clock signal is a latch output signal S321 output from the first latch unit 320, which will be described later.

More specifically, the column counter 208 is a k-bit width (k is a positive integer) counter. In this example, the column counter 208 counts falling edges of the latch output signal S321. The output (COL_COUNTER) of the column counter 208 is k-bit width, and is transmitted onto the output signal bus 126.

Signal Selection Circuit 310

The signal selection circuit 310 selectively outputs either the clock signal S121 (CLK in FIG. 2) output from the clock generator 120 or an inverted signal of the clock signal S121, based on the selection signal SEL. As described later, the selection signal SEL represents the value stored in the second latch unit 330.

In this example, the signal selection circuit 310 includes an inverter 312 and a selector 313. The selector 313 has two input terminals L and H. The selector 313 selects a signal input to one of the input terminals based on the selection signal SEL input to a switch terminal S, and outputs the selected signal. In this example, the input terminal L receives the clock signal S121 output from the clock generator 120, the input terminal H receives the clock signal which is generated by inverting the clock signal S121 by the inverter 312. Thus, the selector 313 selectively outputs either the clock signal S121 or an inverted signal thereof based on the selection signal SEL input to the switch terminal S. In this embodiment, the signal selection circuit 310 selects clock signal S121 when the selection signal SEL is at a low logic level (L level), and selects the output of the inverter 312 (i.e., an inverted signal of the clock signal S121) when the selection signal SEL is at H level. The output (latch clock signal S311) of the signal selection circuit 310 provides the value represented by the lower bits of the count value (see the description of the column counter 208).

The signal selection circuit 310 may be configured using an exclusive OR (EXOR) circuit which receives the clock signal S121 and the selection signal SEL.

First Latch Unit 320

The first latch unit 320 includes one or more latch circuits, and stores the value of the latch clock signal S311. This embodiment provides an example in which the first latch unit 320 includes one latch circuit 1. The first latch unit 320 stores the value of the latch clock signal S311 providing the value represented by the lower bits of the count value. Specifically, a clock input terminal Clk of the latch circuit 1 receives the comparison result signal S123 (CMP) output from the comparator 107, and a data input terminal D of the latch circuit 1 receives the clock signal (latch clock signal S311) output from the signal selection circuit 310. The latch output signal S321 (CLK_LAT) output from a data output terminal Q of the latch circuit 1 is, as described above, input to the column counter 208 as a column counter clock signal. The latch output signal S321 is also input to a data input terminal D of a latch circuit 2 (described later) and to the output signal bus 127.

Second Latch Unit 330

The second latch unit 330 stores a value corresponding to the value stored in the first latch unit 320. In this embodiment, the second latch unit 330 includes one or more latch circuits. This embodiment provides an example in which the second latch unit 330 includes one latch circuit 2. The data input terminal D of the latch circuit 2 receives the latch output signal S321. A clock input terminal Clk of the latch circuit 2 receives the latch control clock signal S341 output from the timing signal generator 340. The output signal from a data output terminal Q of the latch circuit 2 is input to the switch terminal S of the selector 313 as the selection signal SEL.

The terminal Reset of each of the latch circuits 1 and 2, and the column counter 208 receive an initialization signal INI. The latch circuits 1 and 2, and the column counter 208 are initialized in an initialization step ST01, which will be described later.

Operation of Solid-State Imaging Device 1000

Overview

Similarly to a standard MOS solid-state imaging device, in the solid-state imaging device 1000 of this embodiment also, the amount of photoelectric charge calculated by integrating an electrical charge, which is generated by performing photoelectric conversion on the amount of light incident on each pixel 101 of the pixel array 102, for that pixel over a time period from electronic shutter scanning until read scanning controlled by the row-wise scan circuit 930 is the value of a pixel signal S103 (analog signal). Each of the pixel signals S103 read from the respective pixels 101 is converted into a digital signal by the corresponding column ADC 106. The pixel data (digital signal) generated by the AD conversion operation is output through the output buffer 109 to the image signal processing LSI 1001. The image signal processing LSI 1001 performs various signal processing on the pixel data input, and then, for example, an image is displayed on a display of a camera.

AD Conversion Operation in Solid-State Imaging Device 1000

A key aspect of this embodiment is the AD conversion operation. Accordingly, the focus is placed on the AD conversion operation, and thus the AD conversion operation of the solid-state imaging device 1000 will be described below.

Figure 3:
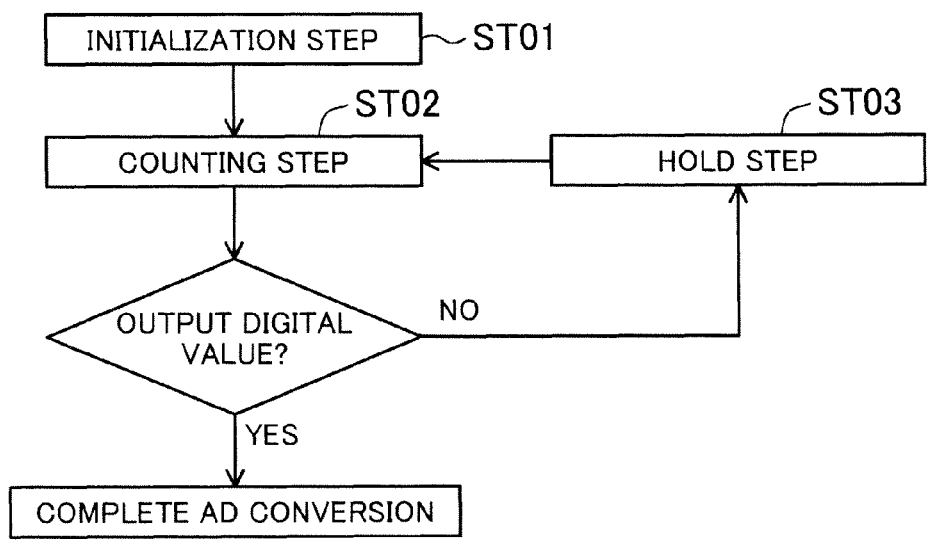
FIG. 3 is a flowchart of steps of the AD conversion operation.
Figure 4:
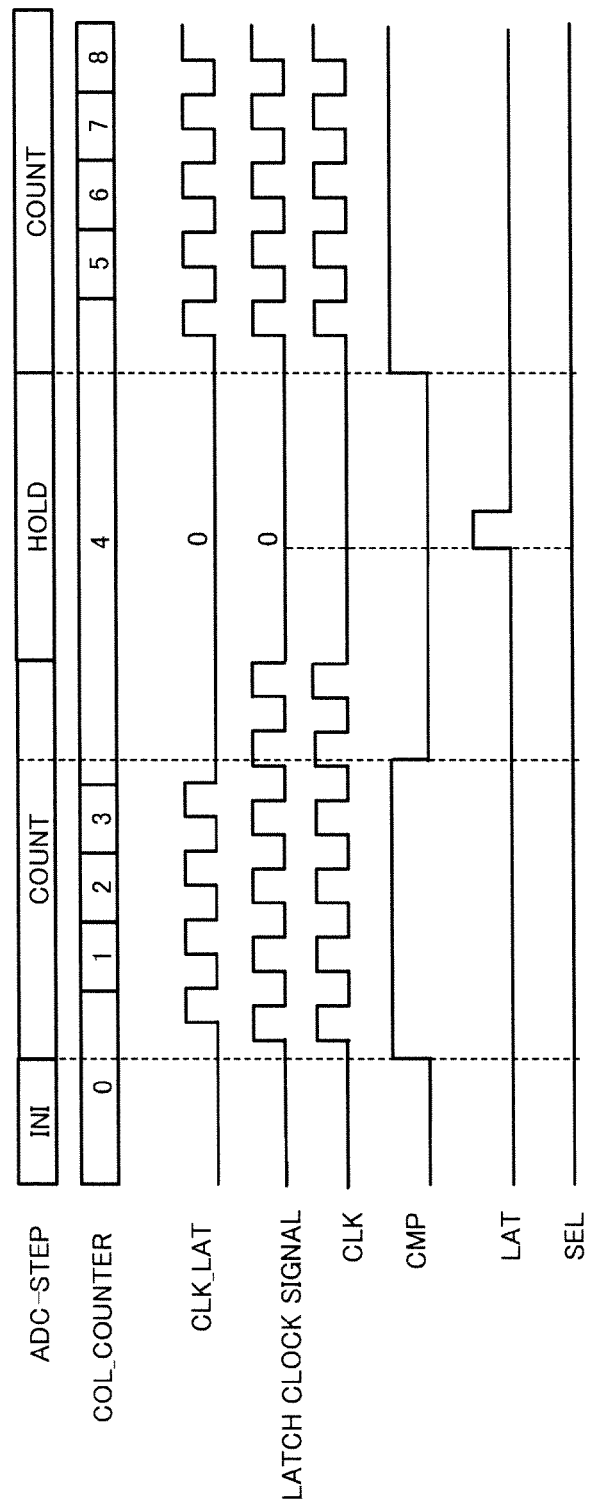
FIG. 4 is a timing diagram of signals in each of the column ADCs, and illustrates operational waveforms when the latch output signal is at L level when the comparison result signal is inverted.
Figure 5:
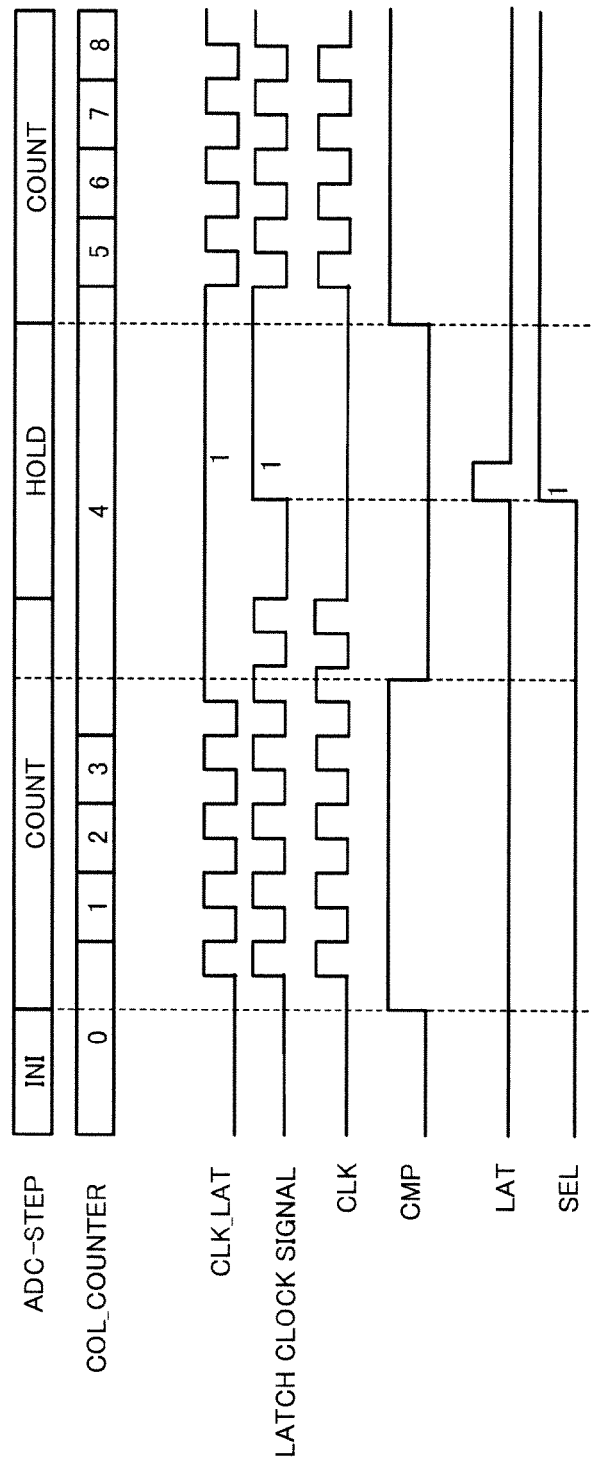
FIG. 5 is a timing diagram of signals in each of the column ADCs, and illustrates operational waveforms when the latch output signal is at H level when the comparison result signal is inverted.

FIG. 3 is a flowchart of steps of the AD conversion operation. FIG. 4 is a timing diagram of signals in each of the column ADCs 160. FIG. 4 illustrates operational waveforms when the latch output signal S321 (CLK_LAT) is at L level when the comparison result signal S123 is inverted. In contrast, FIG. 5 illustrates operational waveforms when the latch output signal S321 is at H level when the comparison result signal S123 is inverted. The AD conversion operation in the solid-state imaging device 1000 is performed generally in three steps; the first step is an initialization step ST01, the second step is a counting step ST02, and the third step is a hold step ST03.

First, the initialization step ST01 initializes the column counter 208, the first latch unit 320, the second latch unit 330, and the comparator 107 in each column ADC 106, and the binary counter 104, by means of the initialization signal INI (see FIG. 2; not shown in FIG. 1). In this step, the DAC 105 supplies a corresponding analog ramp voltage S122 based on the input value from the binary counter 104, to one of the input portions of each comparator 107. Concurrently, when the row-wise scan circuit 930 selects a specific row, each of the pixels 101 in the selected row outputs the pixel signal S103, which is then supplied to the other one of the input portions of that comparator 107. This completes the initialization step ST01. Note that FIGS. 4 and 5 show the above-mentioned steps in the ADC-STEP row, and the initialization step ST01 is shown in the period denoted as INI in the ADC-STEP row.

Figures 6, 7:
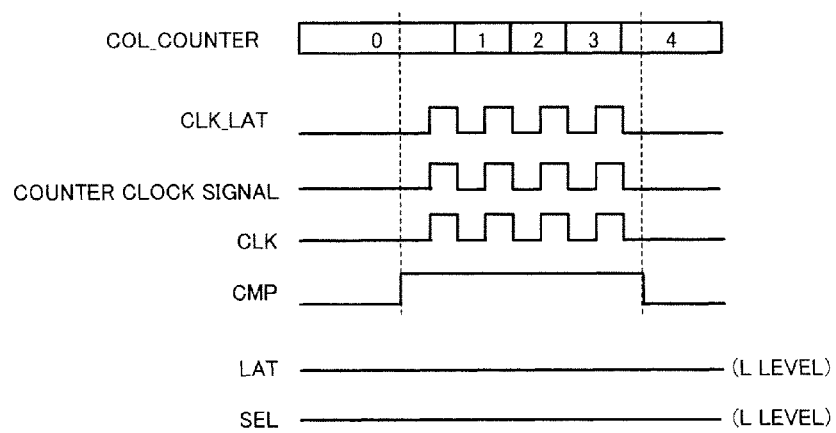
FIG. 6 is a truth table for the latch circuits.
FIG. 7 is a timing diagram of when an AD conversion operation completes.

In this condition, the signal selection circuit 310 receives an initial value of the latch circuit 2 from the data output terminal Q of the latch circuit 2 as the selection signal SEL. FIG. 6 is a truth table for the latch circuits 1 and 2. The truth table of FIG. 6 shows that the initial value of the latch circuit 2 is 1'b0 (1'b0 denotes that a one-bit signal has a value of zero). Thus, the selector 313 selects the clock signal S121. As a result, when the column counter 208 and the latch circuits 1 and 2 in each column ADC 106, and the binary counter 104 have been initialized by the initialization signal INI (not shown in FIG. 1), the data input terminal D of the latch circuit 1 receives the clock signal S121 supplied from the clock generator 120.

At the counting step ST02, the binary counter 104 starts counting from its initial value, and the DAC 105 also starts, from its initial value, generating the analog ramp voltage S122 based on the count value of the binary counter 104. Concurrently, the output of the comparator 107 in each of the columns is set to 1'b1 by the count start signal S342 from the timing signal generator 340, and the column counter 208 in the column ADC 106 in each column also starts counting the latch output signal S321 received.

Then, when, in one column, the relative relationship between the magnitudes of the two signals (the pixel signal S103 and the analog ramp voltage S122) input to the comparator 107 is reversed, the comparison result signal S123 is inverted. This causes the latch circuit 1 to store the value of the latch clock signal S311 as a data value. Concurrently, the column counter 208 stops counting, and stores the count value. The counting step ST02 starts at the beginning of counting, and completes when the counting operation is completed for all the columns. Note that the timing diagrams of FIGS. 4 and 5 show the counting step ST02 in the period denoted as COUNT in the ADC-STEP row.

With the process described above, each of the pixel signals S103 (analog signals) read from the respective pixels 101 is converted into a digital value (COL_COUNTER) stored in the column counter 208, and into a digital value (CLK_LAT) stored in the latch circuit 1 by the AD conversion operation. After this, outputting the resulting digital value from the output buffer 109 completes the AD conversion operation. FIG. 7 is a timing diagram of when an AD conversion operation completes. In the example of FIG. 7, the output from the column ADC 106 has a value of 8, resulting from the least significant bit having a value of 0, which is the value of the signal CLK_LAT, and the remaining upper bits having a value of 4, which is the value of the signal CLK_COUNTER. Thus, the bit accuracy of the column counter 208 is improved by one bit provided by the first latch unit 320 (the latch circuit 1).

In addition, as with the case of digital vertical pixel addition, when the read signal (pixel signal S103; analog signal) in a next row is input continuously, and a counting operation is started with the value stored in that column ADC 106, the process proceeds to the hold step ST03. FIG. 4 etc. show the hold step ST03 in the period denoted as HOLD. In the hold step ST03, first the timing signal generator 340 outputs the latch control clock signal S341 (LAT in FIGS. 4 and 5) of H level, thereby causing the latch circuit 2 to store the value stored in the latch circuit 1.

For example, if the value of the latch circuit 2 is 1'b0 (1'b0 denotes that a one-bit signal is at L level), then as shown in the timing diagram of FIG. 4, the selection signal SEL remains at L level, thereby causing the selector 313 to select the clock signal S121 in the signal selection circuit 310. That is, the data input terminal D of the latch circuit 1 receives the clock signal S121.

In contrast, if the value of the latch circuit 2 is 1'b1 (1'b1 denotes that a one-bit signal is at H level), then as shown in the timing diagram of FIG. 5, the selection signal SEL transitions to H level, thereby causing the selector 313 to select the inverted signal of the clock signal S121 in the signal selection circuit 310. Thus, the data input terminal D of the latch circuit 1 receives the inverted signal of the clock signal S121.

In parallel with this operation, the binary counter 104 is initialized by the initialization signal (not shown), and the DAC 105 supplies an initial value of the analog ramp voltage S122 to one of the input portions of each comparator 107. The pixel signal S103 is read from the corresponding pixel 101 in a row selected by the row-wise scan circuit 930, and is supplied to the other one of the input portions of that comparator 107. Thus, the hold step ST03 completes.

When the hold step ST03 completes, the process proceeds back to the counting step ST02. The counting step ST02 is performed as described above.

Thereafter, the hold step ST03 and the counting step ST02 are repeated a desired number of times (the number of times to perform digital vertical pixel addition). Reading the digital value upon the completion of the counting step ST02 completes the AD conversion operation.

The operation described above can reproduce the state of the latch clock signal S311 when the comparison result signal S123 (CMP in FIG. 7) of the comparator 107 is inverted by the value of the latch circuit 2 (the signal SEL in FIGS. 4 and 5) at a restart of counting. Thus, even when the comparison result signal S123 (CMP) of the comparator 107 returns to H level, the value stored in the latch circuit 1 will not be lost, thereby enabling a counting process to be restarted.

The AD conversion operation described above is performed on the pixel signals S103 of all the columns concurrently and in parallel except for an inverting time delay of the comparison result signal S123 in each column. After the binary counter 104 finishes the counting operation of a predetermined bit width, the column-wise scan units (not shown) each read both the output (CLK_LAT) from the first latch unit 320 (the latch circuit 1) and the output (COL_COUNTER) from the column counter 208 concurrently on a column-by-column basis, and then the output buffer 109 outputs both these outputs as a digital value generated by the AD conversion operation.

Advantage of This Embodiment

As described above, whereas solid-state imaging devices conventionally require the column counters thereof to include as many latch circuits as needed for the number of repetitions of the counting operation, the first embodiment only requires two latch circuits and a signal selection circuit to handle multiple counting operations. For example, if the counting operation is repeated three times, a conventional solid-state imaging device requires latch circuits for three bits in total, while this embodiment only requires latch circuits for two bits, thereby allowing the circuit area needed for the latch circuits to be reduced to two thirds. That is, this means that a solid-state imaging device which repeats a counting operation M times (M is a positive integer) is allowed to reduce the circuit area to 2/M. Thus, the more the number of repetitions of the counting step is, the more the circuit area needed for the latch circuits can be reduced as compared to conventional solid-state imaging devices. That is, according to this embodiment, even when the number of pixels, the frame rate, the conversion bit width, etc. are increased, high image quality and high-speed processing can be achieved while preventing an increase in circuit size.

Figure 8:
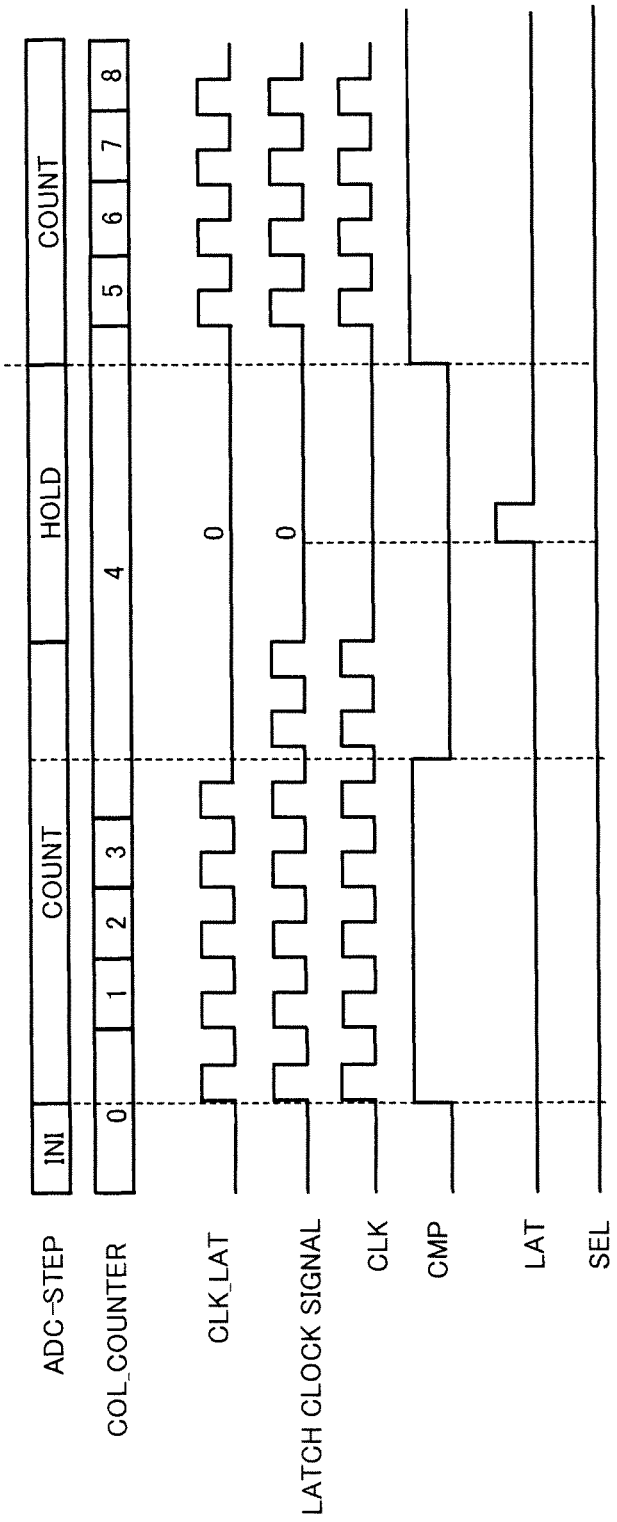
FIG. 8 is a timing diagram of signals in each of the column ADCs when a counter which counts rising edges is used as the column counter, and illustrates operational waveforms when the latch output signal is at L level when the comparison result signal is inverted.
Figure 9:
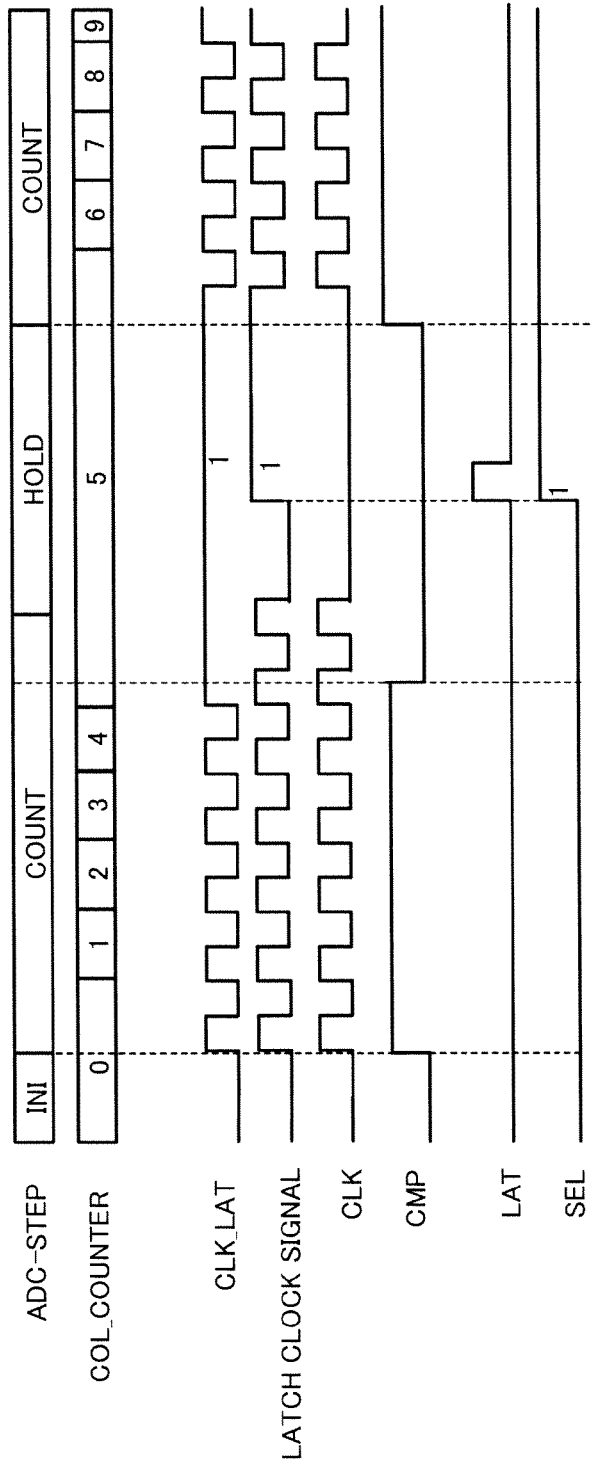
FIG. 9 is a timing diagram of signals in each of the column ADCs when a counter which counts rising edges is used as the column counter, and illustrates operational waveforms when the latch output signal is at H level when the comparison result signal is inverted.
Figure 10:
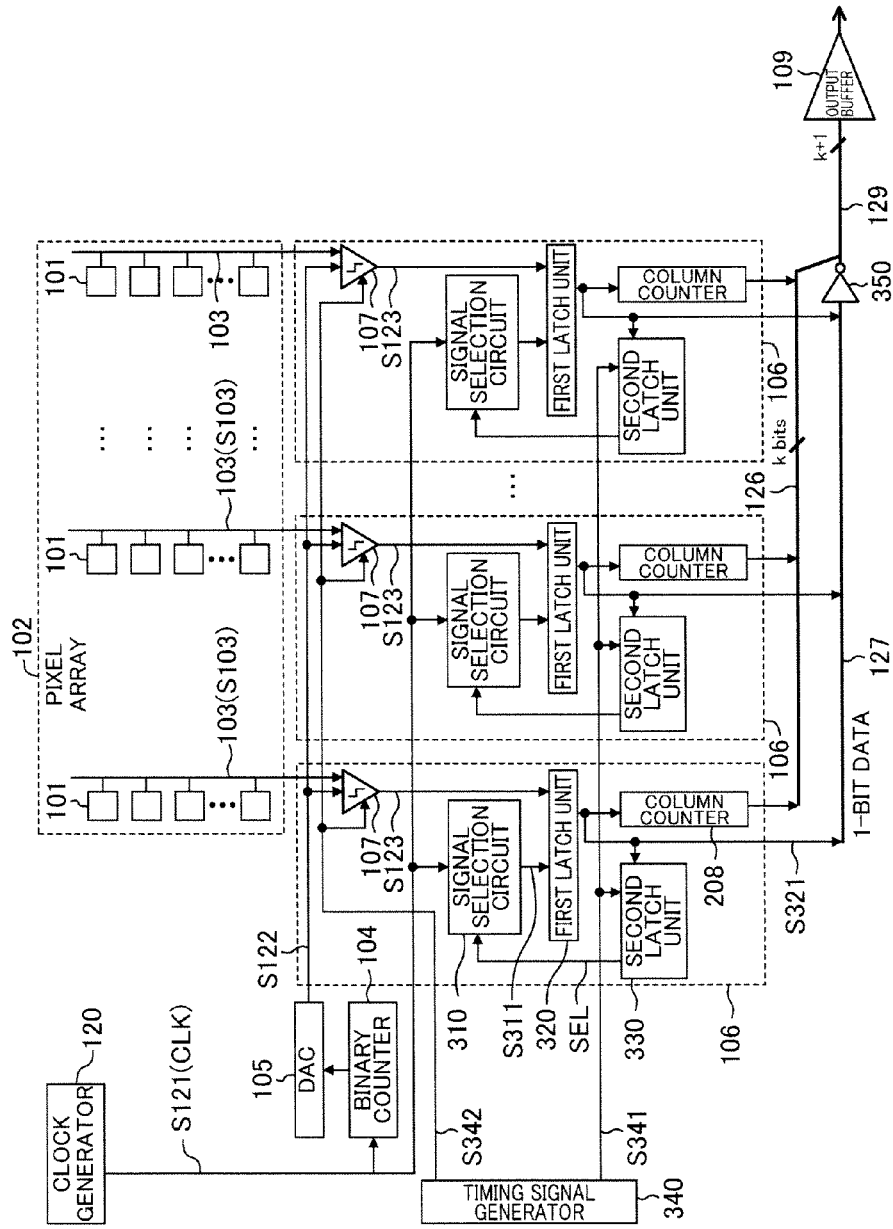
FIG. 10 is a block diagram illustrating an example configuration of the solid-state imaging device when a counter which counts rising edges is used as the column counter.

Note that the column counter 208 of each column ADC 106 may count rising edges. FIG. 8 is a timing diagram of signals in each of the column ADCs 106 when a counter which counts rising edges is used as the column counter 208, and illustrates operational waveforms when the latch output signal S321 is at L level when the comparison result signal S123 is inverted. FIG. 9 is a timing diagram of signals in each of the column ADCs 106 when a counter which counts rising edges is used as the column counter 208, and illustrates operational waveforms when the latch output signal S321 is at H level when the comparison result signal S123 is inverted. As shown in FIGS. 8 and 9, when the value output from the column counter 208 transitions at a rising edge of the clock signal S121, the value 1 or 0 of the least significant bit of the AD conversion result is opposite to that of when falling edges are counted. FIG. 10 is a block diagram illustrating an example configuration of the solid-state imaging device when a counter which counts rising edges is used as the column counter 208. As shown in FIG.

10, an inverter 350 only needs to be added on the output signal bus 127 in the configuration of the solid-state imaging device 1000 of the first embodiment.

Second Embodiment

Figure 11:
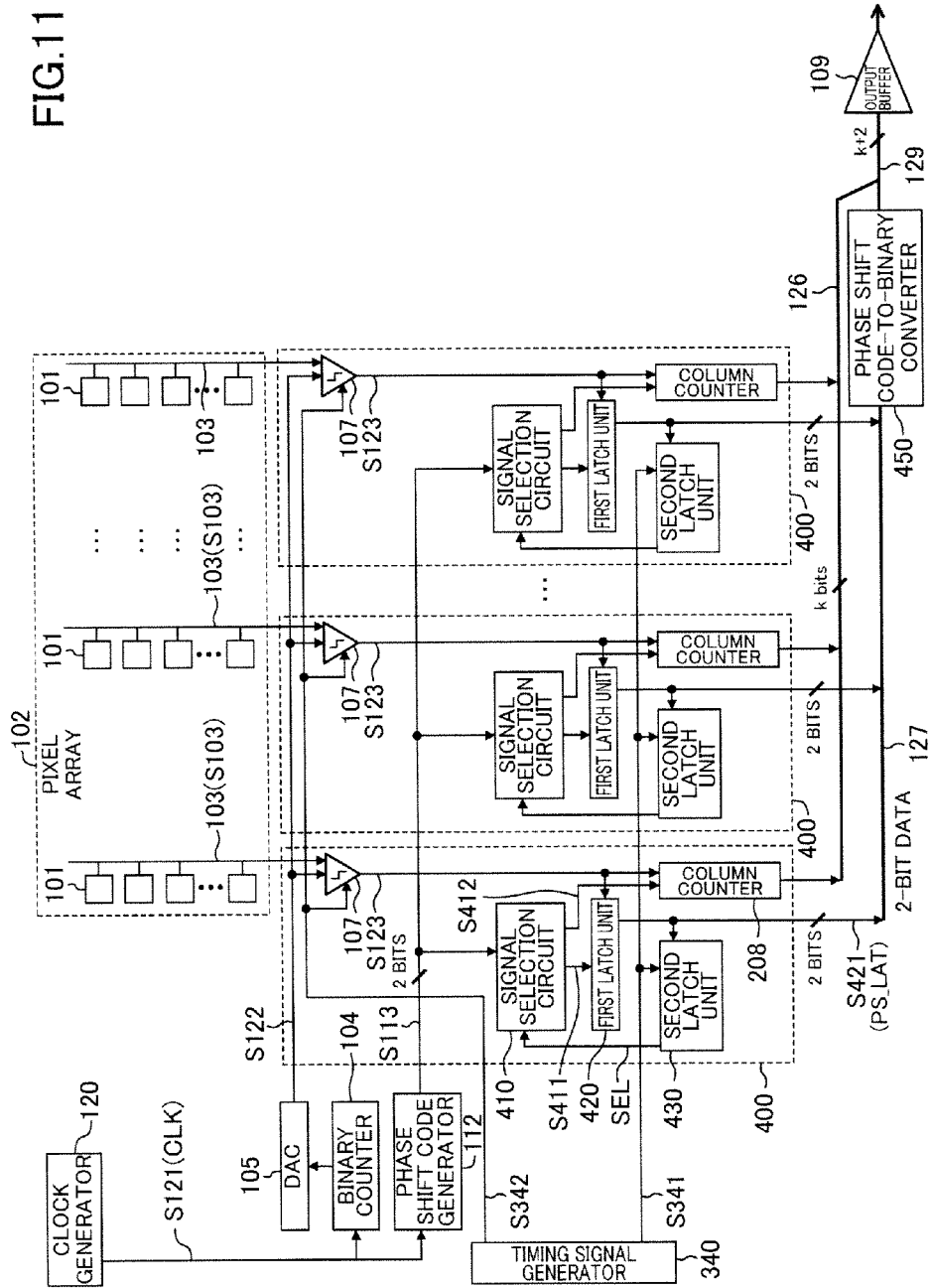
FIG. 11 is a block diagram illustrating a configuration of a solid-state imaging device according to the second embodiment of the present disclosure.

FIG. 11 is a block diagram illustrating a configuration of a solid-state imaging device 2000 according to the second embodiment of the present disclosure. As shown in FIG. 11, the connection between the pixel array 102 and the comparators 107 in the solid-state imaging device 2000 of the second embodiment is similar to that of the solid-state imaging device 1000 of the first embodiment. The solid-state imaging device 2000 differs from the solid-state imaging device 1000 in that a phase shift code generator 112 and a phase shift code-to-binary converter 450 are added, and that the configuration of the column ADCs is changed. In this embodiment also, each of the column ADCs 400 is provided corresponding to each column as shown in FIG. 11.

Phase Shift Code Generator 112

The phase shift code generator 112 generates (m−1) (m is a natural number greater than or equal to two) clock signals sequentially phase-shifted by $\pi/m$ relative to the clock signal S121, and outputs m clock signals including the clock signal S121. Thus, in this embodiment, the clock generator 120 supplies the clock signal S121 to the phase shift code generator 112. Since this embodiment assumes m to be 2, the clock signal S113 output from the phase shift code generator 112 includes the clock signal S121 and a clock signal phase-shifted by $\pi/2$ relative to the clock signal S121. The phase shift code generator 112 outputs the clock signal S113 as a two-bit signal (PS). The phase shift code generator 112 may generate the signal phase-shifted by $\pi/2$, for example, by including a delay locked loop (DLL) circuit, and generating a signal phase-shifted by $\pi/2$ in the DLL circuit.

Figure 12A:
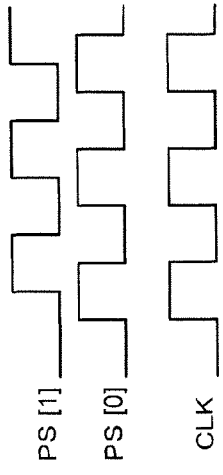
FIG. 12A illustrates the values of phase shift codes when P is 2.
Figure 12B:
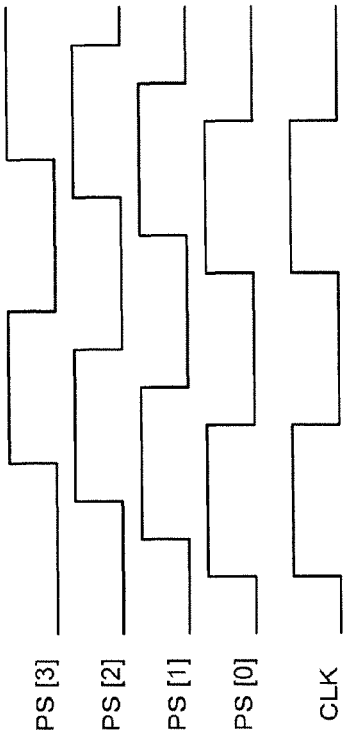
FIG. 12B illustrates the values of phase shift codes when P is 4.

The clock signal S113 output from the phase shift code generator 112 is a phase shift code. As used herein, a "phase shift code" is a binary number in which an increase or decrease in value by 1 causes only one bit to change. More specifically, as the value increases, a next higher bit is sequentially changed on a bit-by-bit basis. That is, a phase shift code of a bit width of P changes so that the number of 1 successively increases in a manner such as "all the bits being zeros," "only the least significant bit being one," "only the two lower bits being 11," etc.; and when all the bits become ones, then the phase shift code changes so that the number of 0 successively increases in a manner such as "all the bits being ones," "only the least significant bit being zero," "only the two lower bits being 00," etc., returning to the starting condition which is "all the bits being zeros." Thus, such a phase shift code can have 2P different code patterns. For example, FIG. 12 illustrates the values of the phase shift codes when P is 2 and P is 4. In this example, the phase shift code generator 112 is an example assuming m to be 2 as described above. Accordingly, the upper bit (PS[1]) of the clock signal S113 carries the clock signal having the same frequency as, and a phase shift of $\pi/2$ relative to, the clock signal S121; the lower bit (PS[0]) carries the clock signal S121 (see the case A of FIG. 12). The clock signal S113 is hereinafter also referred to as "phase shift code."

Column ADC 400

FIG. 13 is a block diagram illustrating in more detail a configuration of the column ADCs 400 of the second embodiment. Each column ADC 400 includes the comparator 107, the column counter 208, a signal selection circuit 410, a first latch unit 420, and a second latch unit 430.

Signal Selection Circuit 410

The signal selection circuit 410 includes two inverters 412 and a selector 413. The selector 413 has four input terminals A1, A2, B1, and B2, a one-bit width output terminal Y1, and a two-bit width output terminal Y2. The selector 413 makes a selection from the inputs (inputs A1, A2, . . . ) input to the four respective input terminals based on the value of the signal input to the switch terminal S, and outputs the selected inputs to the output terminals Y1 and Y2. The switch terminal S receives the signal (selection signal SEL) output from the second latch unit 430. FIG. 14 is a table showing a relationship between the value of the selection signal SEL and the input signals A1, . . . , and B2 output from the output terminals Y1 and Y2.

In this embodiment, the input terminals A1 and A2 receive the clock signal S113 output from the phase shift code generator 112. More specifically, the input terminal A1 receives the clock signal S121, and the input terminal A2 receives the clock signal phase-shifted by $\pi/2$ relative to the clock signal S121. The input terminals B1 and B2 respectively receive, through the inverters 412, signals corresponding to the clock signal S121 and to the clock signal phase-shifted by $\pi/2$ relative to the clock signal S121. Thus, insertion of the inverters 412 causes the input terminal B1 to receive a signal phase-shifted by $\pi$ relative to the clock signal S121, and the input terminal B2 to receive a signal phase-shifted by $3\pi/2$ relative to the clock signal S121.

The output terminal Y1 of the selector 413 is coupled to the column counter 208. The output from the output terminal Y1 is the counter clock signal S412, and the column counter 208 counts the clock signal S412. The output terminal Y2 is coupled to the first latch unit 420. The output from the output terminal Y2 is a phase shift code signal (latch clock signal S411). The latch clock signal S411 also represents the lower bits of the count value.

First Latch Unit 420

The first latch unit 420 stores the latch clock signal S411. The first latch unit 420 of this embodiment is a two-bit latch circuit, and specifically includes two of the one-bit latch circuits 1 therein. In FIG. 13, sub-numerals (-1 and -2) are respectively added to the reference numerals of the latch circuits 1. The clock input terminals Clk of the latch circuits 1-1 and 1-2 each receive the comparison result signal S123 output from the comparator 107. The data input terminal D of the latch circuit 1-1 receives the upper bit (Y2[1]) of the output terminal Y2. The data input terminal D of the latch circuit 1-2 receives the lower bit (Y2[0]) of the output terminal Y2. The data output terminals Q of the latch circuits 1-1 and 1-2 are both coupled to the second latch unit 430. The outputs of the latch circuits 1-1 and 1-2 are input to the second latch unit 430 together as a two-bit width signal (latch output signal S421 (PS_LAT)). The data output terminals Q of the latch circuits 1-1 and 1-2 are also both coupled to the output signal bus 127.

Second Latch Unit 430

The second latch unit 430 stores a value (two bits) stored in the first latch unit 420 (latch circuits 1-1 and 1-2) based on the latch control clock signal S341 (LAT) from the timing signal generator 340. More specifically, the second latch unit 430 is a two-bit latch circuit, and includes two of the one-bit latch circuits 2 therein. In FIG. 13, sub-numerals (-1 and -2) are respectively added to the reference numerals of the latch circuits 2. In this example, the data input terminal D of the latch circuit 2-1 is coupled to the data output terminal Q of the latch circuit 1-1 of the first latch unit 420, and the data input terminal D of the latch circuit 2-2 is coupled to the data output terminal Q of the latch circuit 1-2. The latch output signal S421 (PS_LAT) is input to the data input terminals D. The clock input terminals Clk of the latch circuits 2-1 and 2-2 each receive the latch control clock signal S341 of the timing signal generator 340. An integrated output signal (two bits) from the data output terminals Q of the latch circuits 2-1 and 2-2 is input to the selector 413 of the signal selection circuit 410 as the selection signal SEL.

Phase Shift Code-to-Binary Converter 450

The phase shift code-to-binary converter 450 converts the phase shift code S113 stored in the first latch unit 420 into a binary value of lower bits of the count value. In this example, the phase shift code-to-binary converter 450 is provided on the output signal bus 127, which transmits the output signal from the first latch unit 420. In this embodiment, the output signal bus 127 is two-bit width, and the output signal bus 129 is (k+2)-bit width. The output signal bus 126 (k-bit width) which is coupled to the column counter 208, and the output signal (2 bits) line of the phase shift code-to-binary converter 450 are coupled together to the output signal bus 129 so that the output signal bus 126 carries the upper bits and the output signal line carries the lower bits. That is, the output of the output buffer 109 is (k+2)-bit width digital data.

Figure 15A:
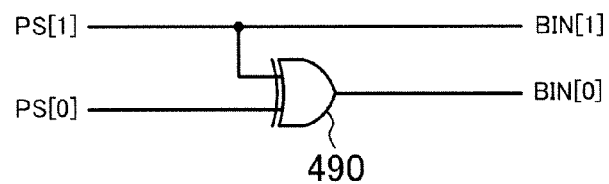
FIGS. 15A and 15B are block diagrams each illustrating an example configuration of the phase shift code-to-binary converter.
Figure 15B:
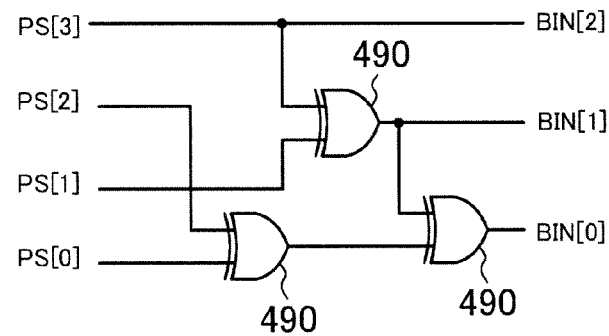
Figure 17:
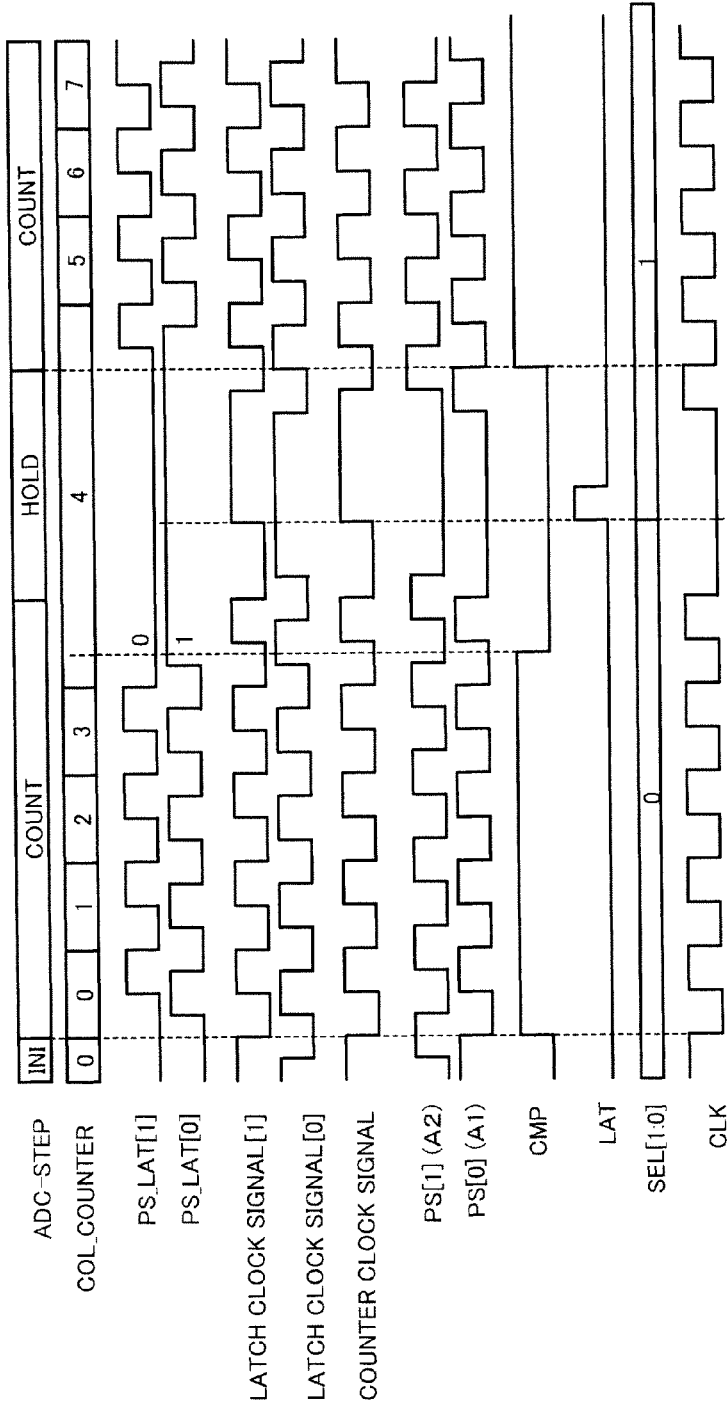
FIG. 17 is a timing diagram of when the value of PS_LAT is 1.
Figure 18:
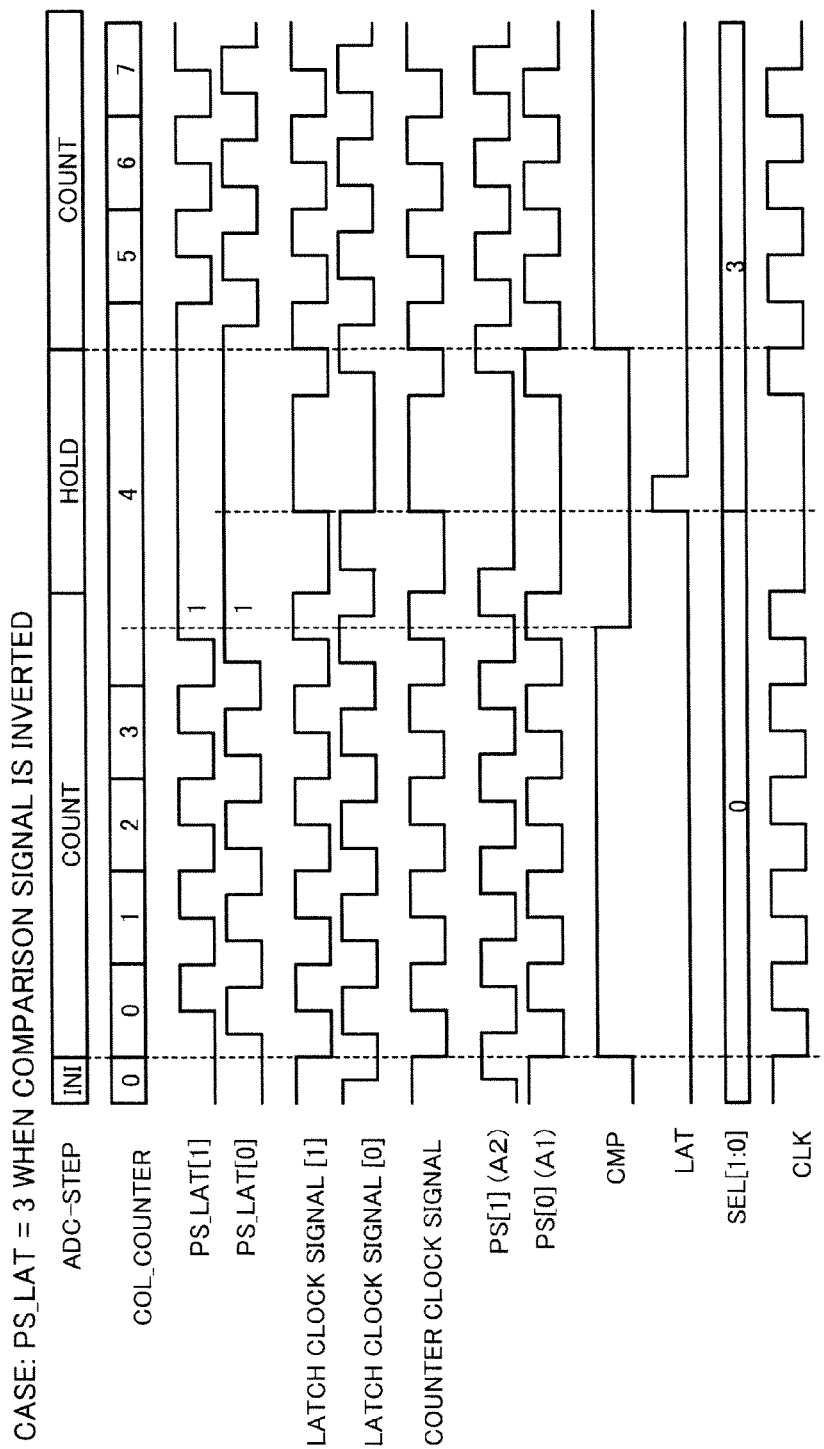
FIG. 18 is a timing diagram of when the value of PS_LAT is 3.
Figure 19:
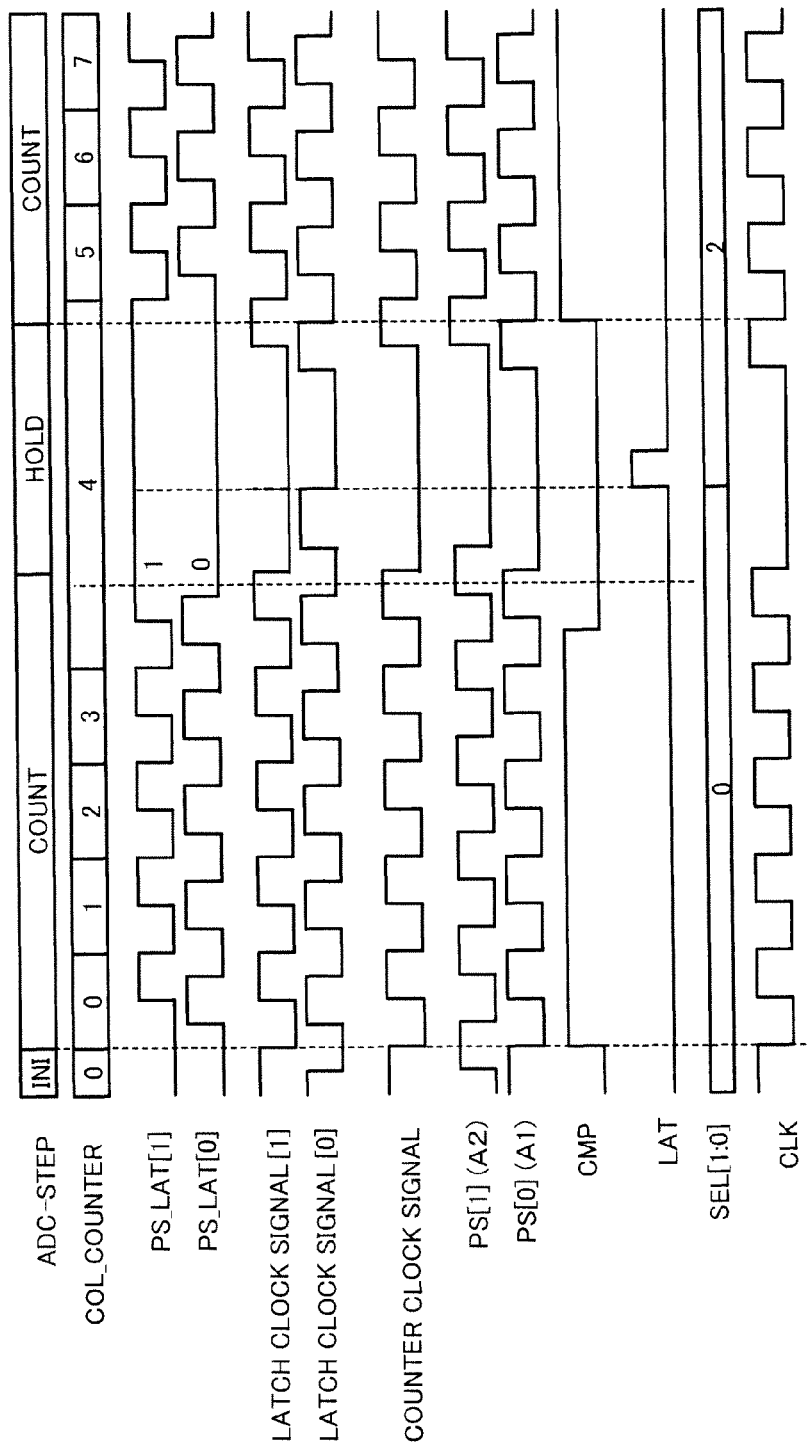
FIG. 19 is a timing diagram of when the value of PS_LAT is 2.

FIGS. 15A and 15B are block diagrams each illustrating an example configuration of the phase shift code-to-binary converter 450. FIG. 15A illustrates an example of P=2 (see FIG. 12), that is, an example of a circuit for converting a two-bit phase shift code into a binary value. In this example, the phase shift code-to-binary converter 450 is formed by one EXOR circuit 490. FIG. 15B illustrates an example of P=4 (see FIG. 12), that is, an example of a circuit for converting a four-bit phase shift code into a binary value. In this example, the phase shift code-to-binary converter 450 is formed by three of the EXOR circuits 490.

AD Conversion Operation in Solid-State Imaging Device 2000

A key aspect of this embodiment is the AD conversion operation. Accordingly, the focus is placed on the AD conversion operation, and thus the AD conversion operation of the solid-state imaging device 2000 will be described below. Also in the solid-state imaging device 2000, the AD conversion operation is performed following the flowchart shown in FIG. 3 similarly to the first embodiment.

The operation at the initialization step ST01 is similar to that of the first embodiment. When the initialization step ST01 has completed, the signal selection circuit 410 receives initial values of the respective latch circuits 2-1 and 2-2 as the two-bit selection signal SEL. In case of the truth table of FIG. 6, the initial value (2 bits) of the latch circuits 2-1 and 2-2 is 2'b00. Here, 2'b00 denotes that a two-bit signal has a value of zero. In this condition, the switch terminal S of the selector 413 receives the value 2'b00; and as shown in FIG. 14, the signal at the input terminal A1 is selected for the output terminal Y1, the signal at the input terminal A1 is selected for the output terminal Y2[1], and the signal at the input terminal B2 is selected for the output terminal Y2[0]. As a result, the column counter 208 is supplied with the clock signal S121. In the first latch unit 420, the upper bit side (latch circuit 1-1) is supplied with the clock signal S121, while the lower bit side (latch circuit 1-2) is supplied with the signal phase-shifted by 3π/2 relative to the signal clock signal S121.

Then, the process proceeds to the counting step ST02, the operation of which is the same as that of the first embodiment. Thus, the explanation thereof will be omitted.

With the process at the counting step ST02, each of the pixel signals S103 (analog signals) read from the respective pixels 101 is converted, by the AD conversion operation, into the value (phase shift code) stored in the column counter 208 and in the first latch unit 420. After this, outputting the resulting digital value from the output buffer 109 completes the AD conversion operation.

When the AD conversion operation is completed, the phase shift code-to-binary converter 450 converts the value of the phase shift code from the column ADC 400 into a binary value. The bus signal which has been converted into a binary value is transmitted onto the output signal bus 126 as the two lower bits, and the resulting signal is output from the output buffer 109 as a (k+2)-bit digital signal. Thus, the bit accuracy of the output digital values is improved by two bits provided by the first latch unit 420 with respect to that of the column counter 208.

For example, as with the case of digital vertical pixel addition, when a counting operation of the read signal (analog signal) in a next line is continuously performed starting with a value stored in that column ADC 400, the process proceeds to the hold step ST03 similarly to the first embodiment. The operation at the hold step ST03 is as follows. First, the value (two bits) stored in the first latch unit 420 (latch circuits 1-1 and 1-2) is stored in the second latch unit 430 (latch circuits 2-1 and 2-2) based on the latch control clock signal S341 of the timing signal generator 340. The signal selection circuit 410 determines the output signal of the selector 413 based on the value stored in the second latch unit 430, selects input signals as shown in the table of FIG. 14, and outputs the selected signals from the output terminals Y1, Y2[1], and Y2[0]. In other words, the signal selection circuit 410 selects bits of the clock signal S113 (phase shift code) so that the latch clock signal S411 and the counter clock signal S412 are respectively in the phase states at the time of change in the comparison result signal S123.

Then, the binary counter 104 is initialized by the initialization signal (not shown), and the DAC 105 supplies an initial value of the analog ramp voltage S122 to one of the input portions of each comparator 107. The pixel signal S103 is read from the corresponding pixel 101 in a selected row, and is supplied to the other one of the input portions of that comparator 107. Thus, the hold step ST03 completes.

When the hold step ST03 completes, the process proceeds back to the counting step ST02. The counting step ST02 is performed as described above. FIGS. 16, 17, 18, and 19 are timing diagrams of four cases based on the two-bit value stored in the second latch unit 430. FIGS. 16, 17, 18, and 19 respectively illustrate cases where the value of PS_LAT is 0, 1, 3, and 2.

As shown in the timing diagrams of FIGS. 16-19, the hold step ST03 causes the column ADC 400 to be supplied with the clock signal S121 (the signal CLK of FIGS. 16-19) which is reset at a restart of counting. However, since the second latch unit 430 stores the value when the comparison result signal S123 (the signal CMP of FIGS. 16-19) is inverted (transitions to L level) in the previous counting step ST02, the latch clock signal S411 and the counter clock signal S412 can be respectively set back, at a restart of counting, to the phase states when the comparison result signal S123 is inverted.

Thereafter, the hold step ST03 and the counting step ST02 are repeated according to the flowchart of FIG. 3. Reading the digital value upon the completion of the counting step ST02 completes the AD conversion operation.

The AD conversion operation described above is performed on the pixel signals S103 of all the columns concurrently and in parallel except for an inverting time delay of the comparison result signal S123 in each column. After the binary counter 104 finishes the counting operation of a predetermined bit width, the column-wise scan units (not shown) each read both the output from the first latch unit 420 and the output from the column counter 208 concurrently on a column-by-column basis, and then the output buffer 109 outputs the digital values generated by the AD conversion operation.

Advantage of Second Embodiment

As described above, according to this embodiment, even when each of the column ADCs 400 includes the latch circuits 1-1 and 1-2 to improve accuracy of the column ADC 400, the circuit area can be reduced as compared to conventional solid-state imaging devices. That is, also in this embodiment, and similarly to the solid-state imaging device 1000 of the first embodiment, repetition of a count-up or count-down operation M times (M is a positive integer) allows the circuit area to be reduced to 2/M, and at the same time achieves as high bit accuracy of AD conversion as that of a conventional solid-state imaging device.

Third Embodiment

Figure 20:
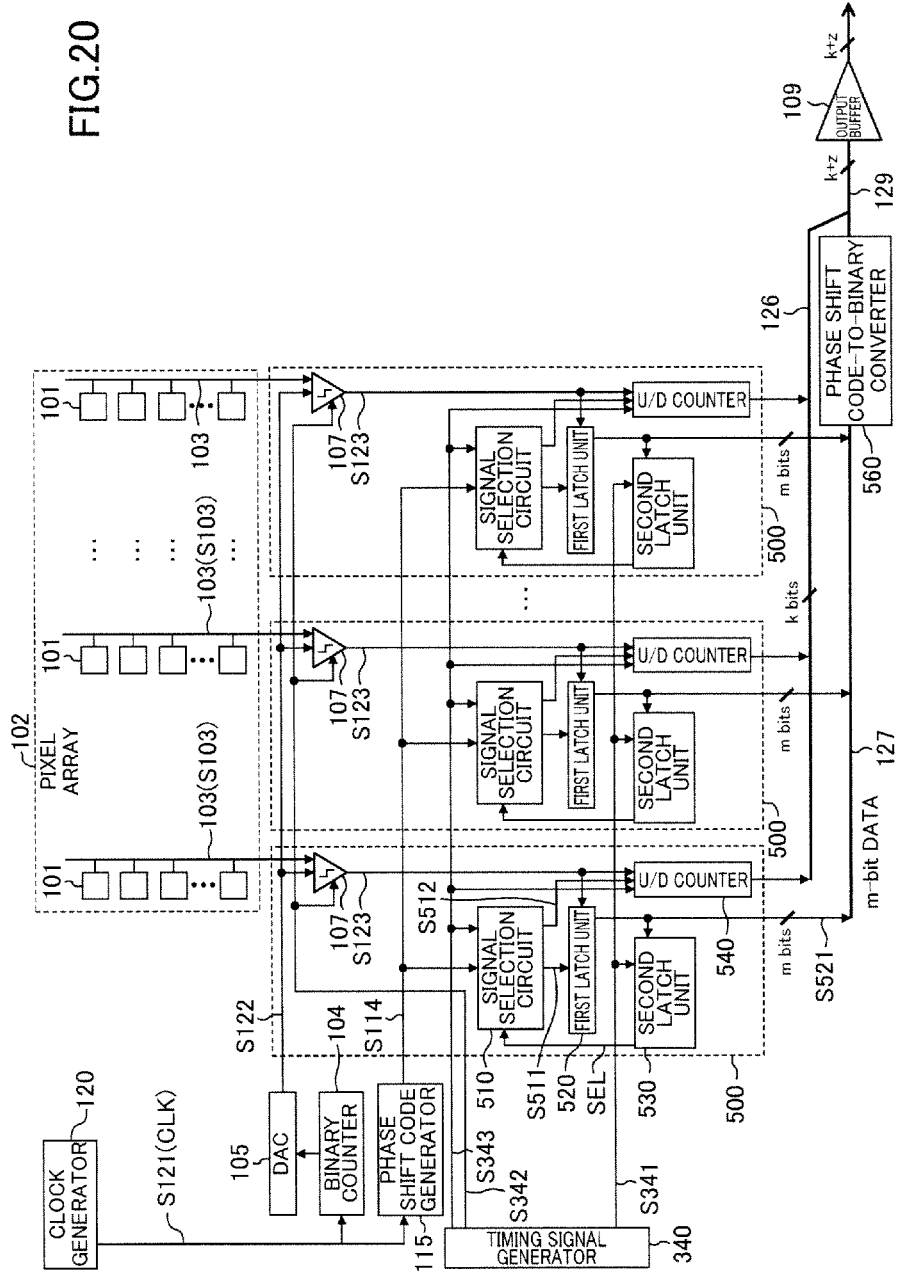
FIG. 20 is a block diagram illustrating a configuration of a solid-state imaging device according to the third embodiment of the present disclosure.

FIG. 20 is a block diagram illustrating a configuration of a solid-state imaging device 3000 according to the third embodiment of the present disclosure. As shown in FIG. 20, the solid-state imaging device 3000 of the third embodiment includes a phase shift code generator 115, column ADCs 500, and a phase shift code-to-binary converter 560 in place of the phase shift code generator 112, the column ADCs 400, and the phase shift code-to-binary converter 450 of the solid-state imaging device 2000 of the second embodiment. This difference involves a change in the configuration of the timing signal generator 340. Note that, also in this embodiment, each of the column ADCs 500 is provided corresponding to each column as shown in FIG. 20. In addition, as shown in FIG. 20, the connection between the pixel array 102 and the comparators 107 in the solid-state imaging device 3000 is similar to that of the solid-state imaging device 2000 of the second embodiment.

Phase Shift Code Generator 115

The output of the phase shift code generator 115 of the third embodiment is an m-bit width (m is a positive integer) phase shift code signal S114.

Timing Signal Generator 340

The timing signal generator 340 outputs an up/down (U/D) control signal S343 in addition to both the latch control clock signal S341 and the count start signal S342. The U/D control signal S343 instructs an up/down (U/D) counter 540 (described later) to count up at H level, and to count down at L level. The initial value of the U/D control signal S343 is a logical 1 (H level).

Column ADC 500

Figure 21:
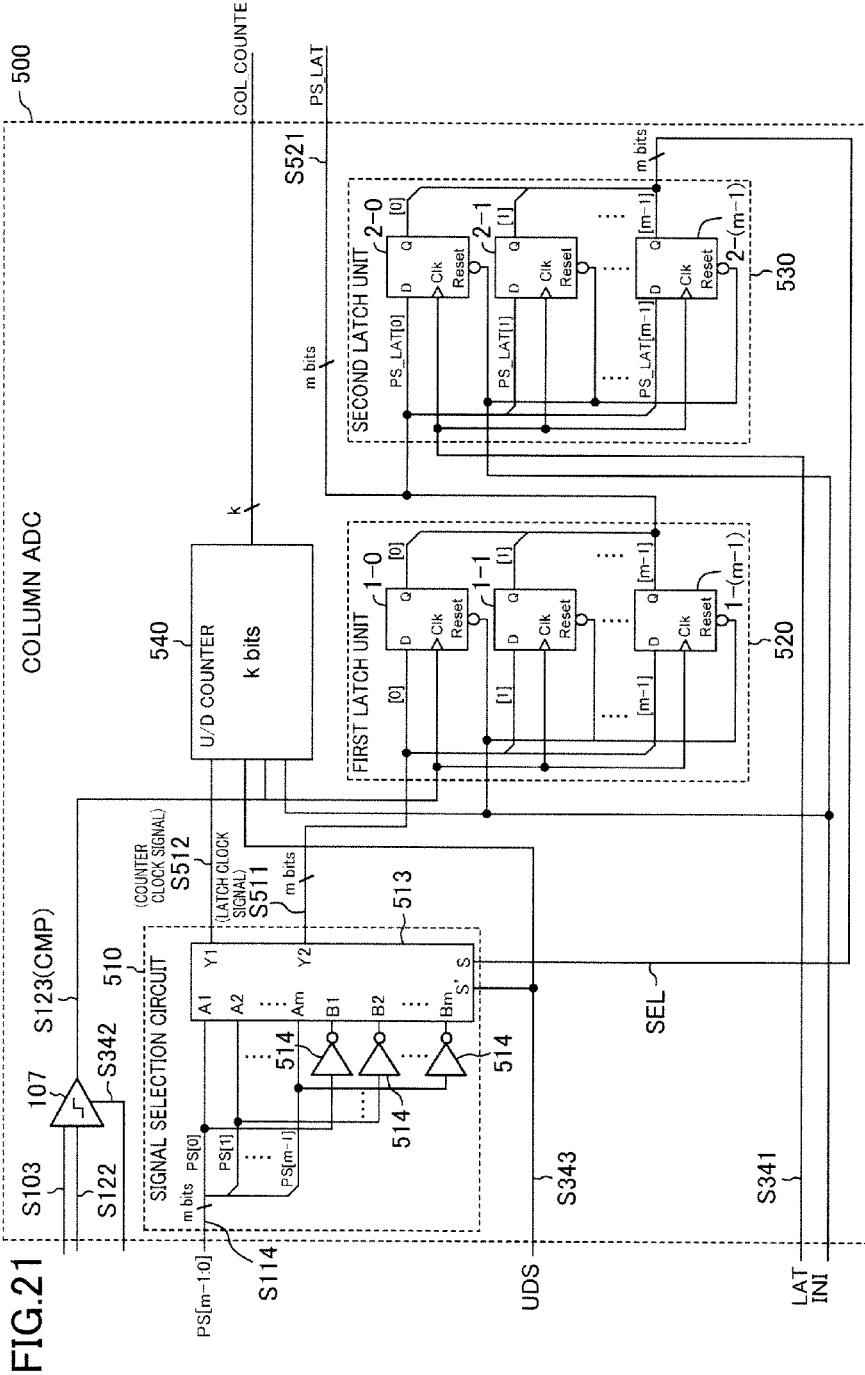
FIG. 21 is a block diagram illustrating in more detail a configuration of the column ADCs of the third embodiment.
Figure 25:
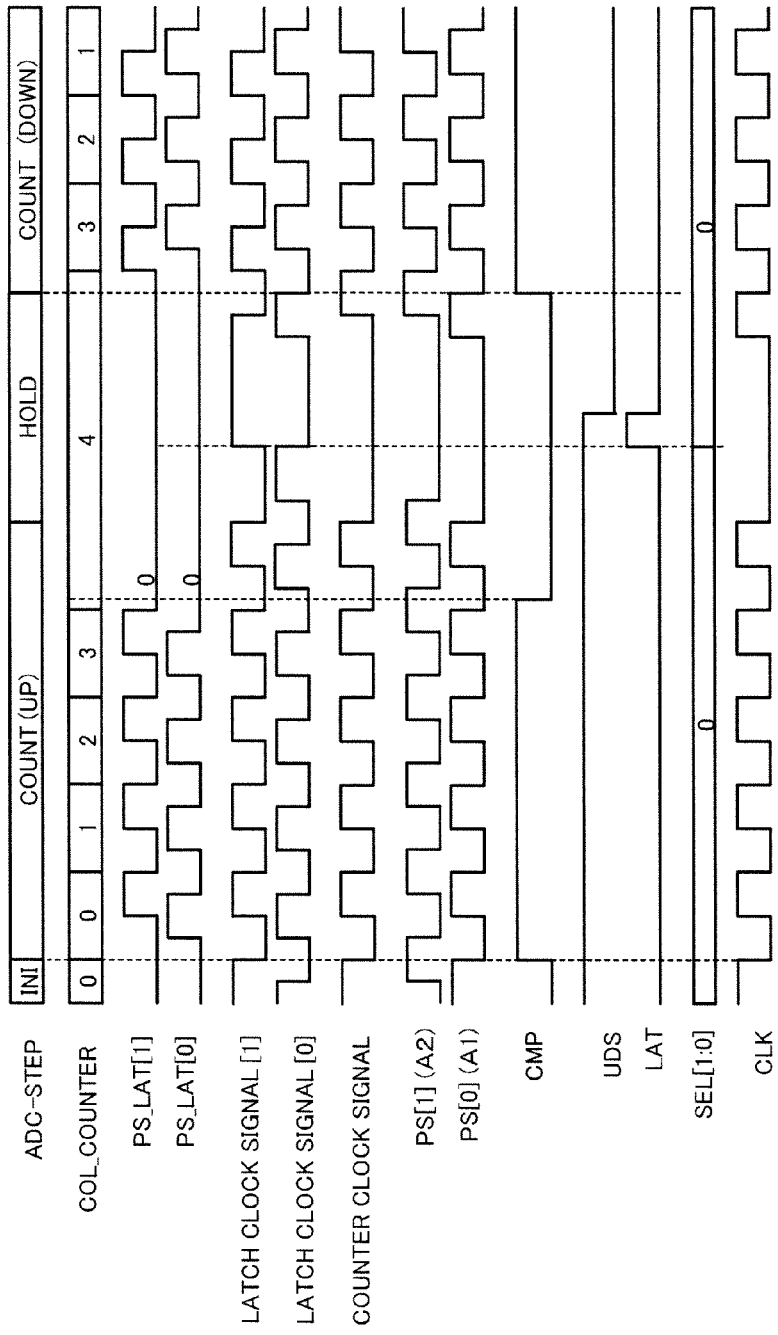
FIG. 25 is a timing diagram of a process starting with the initialization step, and transitioning to the counting step (count-up), to the hold step, and to the counting step (count-down) in a case where PS_LAT=0 when the comparison result signal is inverted.
Figure 26:
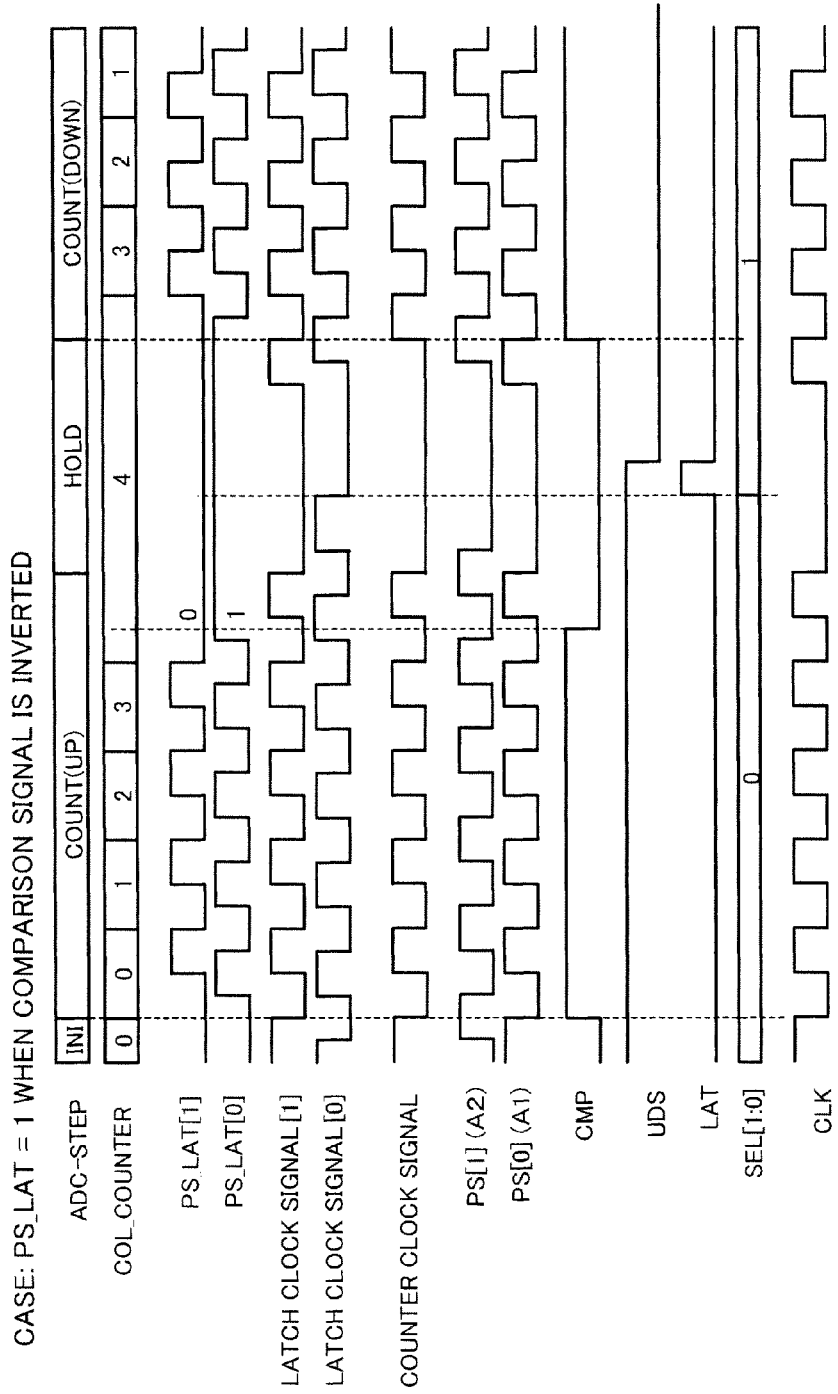
FIG. 26 is a timing diagram of a process starting with the initialization step, and transitioning to the counting step (count-up), to the hold step, and to the counting step (count-down) in a case where PS_LAT=1 when the comparison result signal is inverted.
Figure 27:
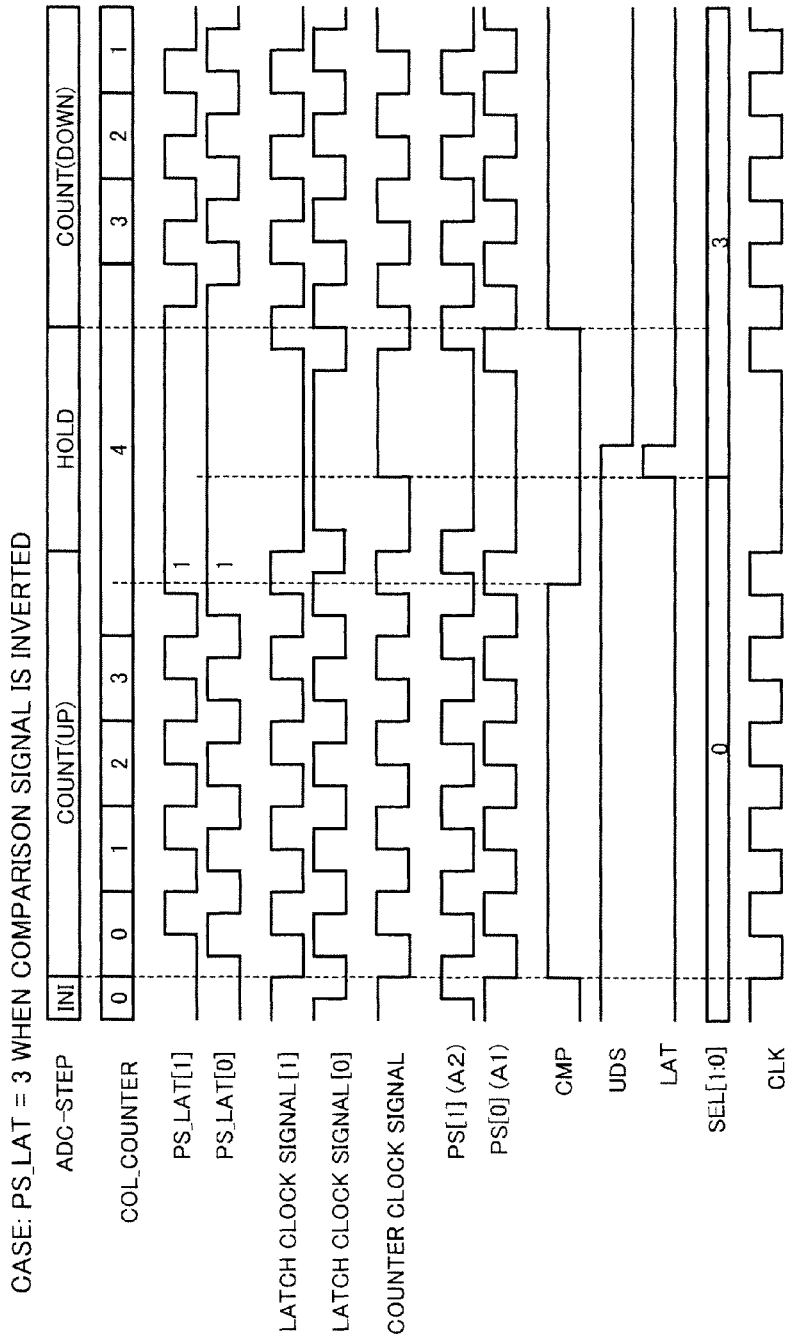
FIG. 27 is a timing diagram of a process starting with the initialization step, and transitioning to the counting step (count-up), to the hold step, and to the counting step (count-down) in a case where PS_LAT=3 when the comparison result signal is inverted.
Figure 28:
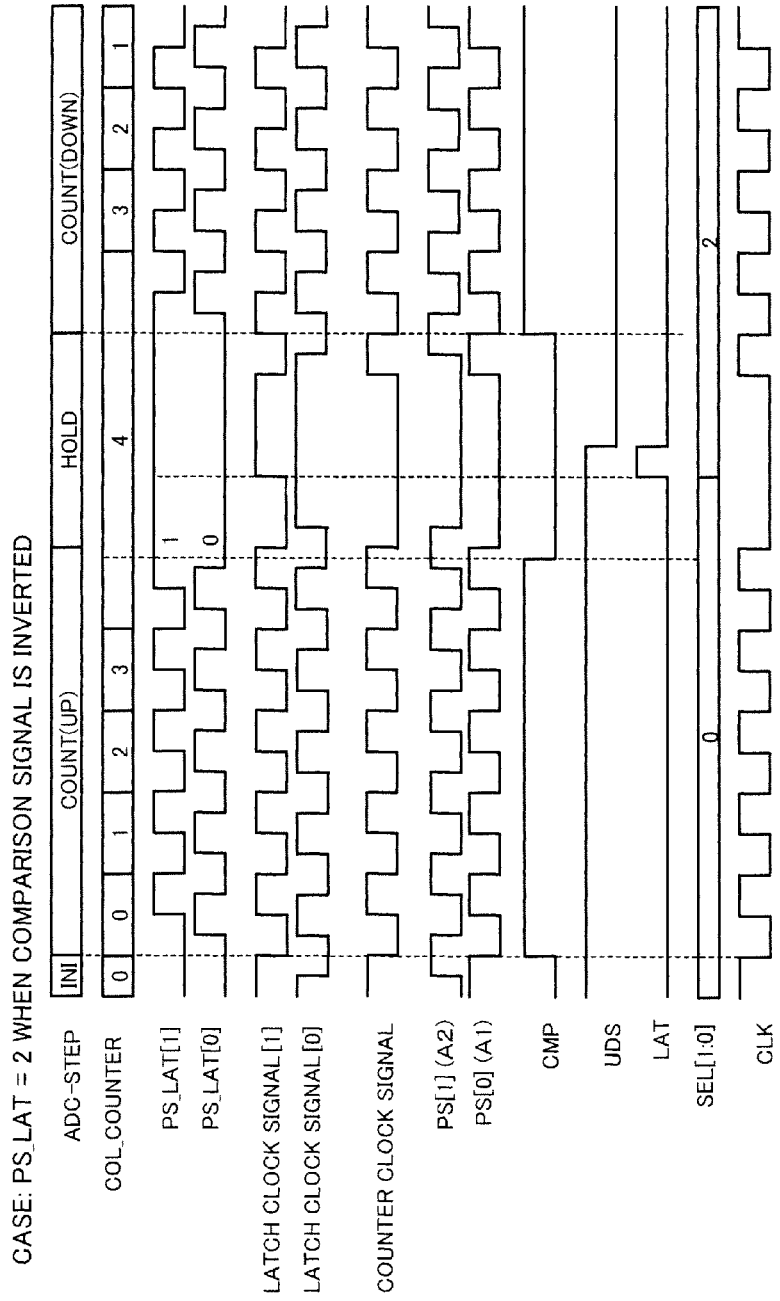
FIG. 28 is a timing diagram of a process starting with the initialization step, and transitioning to the counting step (count-up), to the hold step, and to the counting step (count-down) in a case where PS_LAT=2 when the comparison result signal is inverted.

FIG. 21 is a block diagram illustrating in more detail a configuration of the column ADCs 500 of the third embodiment. Each column ADC 500 includes the comparator 107, a signal selection circuit 510, a first latch unit 520, a second latch unit 530, and the U/D counter 540 (column counter).

Signal Selection Circuit 510

The signal selection circuit 510 includes a selector 513 and m inverters 514.

The selector 513 has 2 m one-bit width input terminals A1, A2, ..., Am, B1, B2, ..., and Bm, a one-bit width output terminal Y1, and an m-bit width output terminal Y2. The selector 513 makes a selection from the inputs input to the 2 m input terminals based on the values of the signals respectively input to two switch terminals S and S', and outputs the selected inputs to the output terminals Y1 and Y2. The switch terminal S receives the m-bit width signal (selection signal SEL) output from the second latch unit 530; the switch terminal S' receives the U/D control signal S343 (UDS of FIG. 21). FIG. 22 is a table showing a relationship between the values of the signals input to the switching terminals S and S' of the signal selection circuit 510 and input terminals A1, ..., and Bm coupled to the output terminals Y1 and Y2 when the value of m is 2. FIG. 23 is a table showing a relationship between the value of the signal input to the switch terminal S and the input terminals A1, ..., and Bm coupled to the output terminals Y1 and Y2 when the value of the signal input to the switch terminal S' is H level in a case where the value of m is 4. Similarly, FIG. 24 is a table showing a relationship between the value of the signal input to the switching terminal S and the input terminals A1, ..., and Bm coupled to the output terminals Y1 and Y2 when the value of the signal input to the switch terminal S' is L level in a case where the value of m is 4.

In this embodiment, the input terminals A1, A2, ..., and Am receive the phase shift code signal S114 output from the phase shift code generator 115. The input terminals B1, ..., and Bm receive, through the inverters 514, signals corresponding to the clock signal S121 and to the clock signal phase-shifted by $\pi/2$ relative to the clock signal S121. Thus, insertion of the inverters 514 causes the input terminals B1, ..., and Bm to respectively receive signals phase-shifted by $\pi$ relative to the respective bits of the phase shift code signal S114.

The output from the output terminal Y1 of the selector 513 is a counter clock signal S512, and the output terminal Y1 is coupled to the U/D counter 540. The output terminal Y2 is coupled to the first latch unit 520. The output signal (phase shift code signal S511) from the output terminal Y2 is input to the first latch unit 520 as the latch clock signal as described later.

First Latch Unit 520

The first latch unit 520 is an m-bit latch circuit, and includes m of the one-bit latch circuits 1 therein. In FIG. 21, sub-numerals (-0, -1, ..., and -(m−1)) are respectively added to the reference numerals of the latch circuits 1. The clock input terminals Clk of the latch circuits 1-0, 1-1, ..., and 1-(m−1) each receive the comparison result signal S123 output from the comparator 107. The data input terminal D of the n-th (where n is 0, 1, 2, ..., and m−1) latch circuit 1-n receives the n-th bit of the output terminal Y2. The data output terminals Q of the latch circuits 1-0, 1-1, ..., and 1-(m−1) are coupled to the second latch unit 530. The outputs of the latch circuits 1-0, 1-1, . . . , and 1-(m−1) are input to the second latch unit 530 together as an m-bit width signal (latch output signal S521 (PS_LAT)) (see FIG. 21). The data output terminals Q of the latch circuits 1-0, 1-1, . . . , and 1-(m−1) are also coupled to the output signal bus 127.

Second Latch Unit 530

The second latch unit 530 stores a value (m bits) stored in the first latch unit 520 (latch circuits 1-0, 1-1, etc.) based on the latch control clock signal S341 from the timing signal generator 340. More specifically, the second latch unit 530 includes m of the latch circuits 2. In FIG. 21, sub-numerals (-0, -1, . . . , and -(m−1)) are respectively added to the reference numerals of the latch circuits 2. The data input terminal D of the n-th (where n is 0, 1, 2, . . . , and m−1) latch circuit 2-n is coupled to the data output terminal Q of the n-th latch circuit 1-n. The clock input terminals Clk of the latch circuits 2-0, 2-1, . . . , and 2-(m−1) each receive the latch control clock signal S341 of the timing signal generator 340. An integrated output signal (m bits) from the data output terminals Q of the latch circuits 2-0, 2-1, . . . , and 2-(m−1) is input to the selector 513 of the signal selection circuit 510 as the selection signal SEL.

U/D Counter 540

The U/D counter 540 counts a column counter clock signal, which is either the clock signal S121 or a phase-shifted clock signal S121, and stores a value represented by upper bits of the count value at the time of change in the comparison result signal S123. More specifically, the U/D counter 540 of this embodiment counts up or down the counter clock signal S512 based on the U/D control signal S343. The U/D counter 540 stops counting when the comparison result signal S123 output from the comparator 107 is inverted.

The U/D counter 540 is a k-bit width (k is a positive integer) counter. The output (COL_COUNTER) of the U/D counter 540 is also k-bit width, and is transmitted onto the output signal bus 126. The U/D counter 540 receives the initialization signal INI, thereby allowing a reset operation to be performed from outside that column ADC 500.

Phase Shift Code-to-Binary Converter 560

The phase shift code-to-binary converter 560 is provided on the output signal bus 127 which transmits the output signal from the first latch unit 520, and converts the m-bit width phase shift code into a z-bit width binary value (where z is a value as expressed by the equation $m=2^{(z-1)}$). The phase shift code signal S511 (latch clock signal) represents the lower bits, of the count value, which are z-bit width (where z is a value as expressed by the equation $m=2^{(z-1)}$).

In this embodiment, the output signal bus 127 is m-bit width, and the output signal bus 129 is (k+z)-bit width. The output signal bus 126 (k-bit width) which is coupled to the U/D counter 540, and the output (z-bit width) of the phase shift code-to-binary converter 560 are coupled together to the output signal bus 129 so that the output signal bus 126 carries the upper bits and the output signal carries the lower bits. That is, the output of the output buffer 109 is (k+z)-bit width digital data.

AD Conversion Operation in Solid-State Imaging Device 3000

A key aspect of this embodiment is the AD conversion operation. Accordingly, the focus is placed on the AD conversion operation, and thus the AD conversion operation of the solid-state imaging device 3000 will be described below. Also in the solid-state imaging device 3000, the AD conversion operation is performed following the flowchart shown in FIG. 3 similarly to the first embodiment.

FIGS. 25, 26, 27, and 28 are timing diagrams of processes starting with the initialization step ST01, and transitioning to the counting step ST02 (count-up), to the hold step ST03, and to the counting step ST02 (count-down) when m=2. More specifically, FIGS. 25, 26, 27, and 28 respectively illustrate examples of when the value of PS_LAT is 0, 1, 3, and 2.

During the initialization step ST01, the value of the U/D control signal S343 needs to be fixed in order to determine the operation of the U/D counter 540 etc. Thus, the initialization step ST01 also performs a determination operation of the value of the U/D control signal S343, in addition to the operation in the initialization step ST01 of the first embodiment. Since the counting step ST02 after the initialization step ST01 is a count-up step here, the timing signal generator 340 determines that the value of the U/D control signal S343 is a logical 1 (H level) in the initialization step ST01. If, in contrast, the counting step ST02 after the initialization step ST01 is a count-down step, the timing signal generator 340 needs to determine that the value of the U/D control signal S343 is a logical 0 (L level) in the initialization step ST01. The rest of the operation in the initialization step ST01 is similar to that of the first embodiment.

When the initialization step ST01 has completed, the signal selection circuit 510 is supplied with an m-bit signal from the phase shift code generator 115. More specifically, the input terminal A1 of the selector 513 in the signal selection circuit 510 is supplied with the clock signal S121; the input terminal A2 is supplied with a clock signal phase-shifted by π/m relative to the clock signal S121; the input terminal A3 is supplied with a clock signal phase-shifted by 2π/m relative to the clock signal S121; and the other input terminals including the last input terminal Am are supplied with respective clock signals in a similar manner. That is, the x-th (where x is a number from 1 to m) input terminal Ax is supplied with a clock signal having a phase delayed by (x−1)·π/m relative to the clock signal S121. Similarly, the x-th (where x is a number from 1 to m) input terminal Bx is supplied with a clock signal having a phase delayed by {(x−1)·π/m+π} relative to the clock signal S121.

The signal selection circuit 510 also receives initial values of the respective latch circuit 2-0, 2-1, . . . , and 2-(m−1) from the second latch unit 530 as the selection signal SEL. For example, if the initial value of the selection signal SEL is zero, then the switch terminal S of the selector 513 is supplied with a value 0. In addition, since the U/D control signal S343 is fixed at a logical 1 (H level) as described above, the switch terminal S' is supplied with a value 1. As a result, the output of the selector 513, that is, the signals input to the first latch unit 520 and to the U/D counter 540 will be in the initial state at the start of counting. More specifically, the value of the latch clock signal S511 (phase shift code signal) will be zero, and the counter clock signal S512 will be in a reset state. Note that, even if the initial value output from the second latch unit 530 is 1, the clock signals respectively input to the first latch unit 520 and to the U/D counter 540 can be set to the initial state at the start of counting by appropriately configuring the selector 513. Also, even if the logic of the U/D control signal S343 is inverted, or the initial value is not zero, the clock signals respectively input to the first latch unit 520 and to the U/D counter 540 can be set to the initial state at the start of counting (i.e., the value of the phase shift code signal S511 is zero, and the counter clock signal S512 is in a reset state) by appropriately configuring the selector 513.

After the initialization step ST01 completes, the process proceeds to the counting step ST02. In the counting step ST02, the binary counter 104 starts counting from its initial value, and the DAC 105 also starts, from its initial value, generating the analog ramp voltage S122 based on the count value of the binary counter 104. When the timing signal generator 340 outputs the count start signal S342, the output of the comparator 107 in each of the column ADCs 500 is set to 1'b1, and the U/D counter 540 starts counting the counter clock signal S512 received. In this regard, the U/D counter 540 performs a count-up operation when the value of the U/D control signal S343 output from the timing signal generator 340 is a logical 1 (H level), and performs a count-down operation when the value of the U/D control signal S343 is a logical 0 (L level).

Next, when, in one column, the relative relationship between the magnitudes of the two signals (the analog ramp voltage S122 and the pixel signal S103) input to the comparator 107 is reversed, the comparison result signal S123 is inverted. This causes the first latch unit 520 to store the value of the phase shift code signal S511 (latch clock signal) as a data value. Concurrently, the U/D counter 540 stops counting, and stores therein the count value. The counting step ST02 starts at the beginning of counting, and completes when the counting operation is completed for all the columns. With the process described above, each of the pixel signals S103 (analog signals) read from the respective pixels 101 is converted, by the AD conversion operation, into digital values (digital signals) respectively stored in the U/D counter 540 and in the first latch unit 520.

After this, outputting the resulting digital value from the output buffer 109 completes the AD conversion operation. When the AD conversion operation completes, the m-bit width clock signal S512 (PS_LAT), which is the output from the first latch unit 520, is converted into a signal of a z-bit binary value by the phase shift code-to-binary converter 560. The z-bit width signal is combined with the k-bit width signal (COL_COUNTER) output from the U/D counter 540, and the resulting signal is output from the output buffer 109 as a (k+z)-bit binary digital signal. Thus, the bit accuracy of the output from the column ADC 500 is improved by z bits with respect to k bits of the output from the U/D counter 540.

If a count-up or count-down operation of the read signal (analog signal) in a next line is continuously performed starting with a value stored in that column ADC 500, the process proceeds to the hold step ST03. In the operation at the hold step ST03, similarly to the first embodiment, the second latch unit 530 stores the value stored in the first latch unit 520 based on the latch control clock signal S341 (the signal LAT in FIGS. 25-28) from the timing signal generator 340. Then, the value stored in the second latch unit 530 determines the value of the selection signal SEL input to the switch terminal S of the selector 513 in the signal selection circuit 510. In parallel with this operation, the timing signal generator 340 sets the U/D control signal S343 to a logical 1 if a count-up operation is to be performed in the next counting step ST02, and to a logical 0 if a count-down operation is to be performed. FIGS. 25-28 show the U/D control signal S343 by the waveforms labeled UDS, and illustrate by way of example cases where the value changes from 1 to 0, that is, the counting operation transitions from count-up to count-down. Note that if the counting operation is to transition from count-down to count-up, then the U/D control signal S343 needs to be changed from 0 to 1 in the hold step ST03. If the counting operation is to proceed from count-up to count-up, and/or from count-down to count-down, then the value of the U/D control signal S343 needs to be just maintained.

Once the values of the input signals to the switch terminal S and S' of the selector 513 are determined, the selector 513 makes a selection for the signals (the phase shift code signal S511 and the clock signal S512) respectively supplied to the first latch unit 520 and to the U/D counter 540 at the start of the next counting step ST02. The selector 513 of this embodiment makes a selection from the input signals A1-Am and B1-Bm so that the outputs from the output terminals Y1 and Y2 will be in the same states as those when the output (comparison result signal S123) of the comparator 107 is inverted. The state when the output of the comparator 107 is inverted during the previous counting step ST02 is determined by the selection signal SEL to the selector 513. In addition, whether the phase shift code changes to count up or count down based on the setting of count-up or count-down is determined by the U/D control signal S343. Thus, the information required to restart counting with the state stored by the first latch unit 520 in the previous counting operation can be clearly identified by the combination of the signals respectively input to the switch terminals S and S'. For example, such a process can be implemented by the selector 513 having the input-output relationship of FIG. 22 in a case of m=2, and the input-output relationships of FIGS. 23 and 24 in a case of m=4. Such a process can also be implemented in a similar manner in a case where m is 5 or higher.

Then, the binary counter 104 is initialized by the initialization signal (not shown), and the DAC 105 supplies an initial value of the analog ramp voltage S122 to one of the input portions of each comparator 107. The pixel signal S103 is read from the corresponding pixel 101 in a selected row, and is supplied to the other one of the input portions of that comparator 107. Thus, the hold step ST03 completes.

When the hold step ST03 completes, the process proceeds back to the counting step ST02. The counting step ST02 is performed as described above.

As shown in the timing diagrams of FIGS. 25-28, performing the hold step ST03 causes the column ADC 500 to be supplied with the clock signal S121 (the signal CLK of FIGS. 25-28) which is reset at a restart of counting. In this process, since the second latch unit 530 stores the value (the signal SEL of FIGS. 25-28) when the comparison result signal S123 (the signal CMP of FIGS. 25-28) is inverted (transitions to L level) in the previous counting step ST02, the clock signals (the latch clock signal S511 and the counter clock signal S512) respectively supplied to the first latch unit 520 and to the U/D counter 540 can be set back, at a restart of counting, to the phase states when the comparison result signal S123 is inverted. In addition, by changing the latch clock signal S511 (phase shift code signal) output from the signal selection circuit 510 to the first latch unit 520 based on the value of the U/D control signal S343, the first latch unit 520 can perform not only a count-up operation but also a count-down operation.

Thereafter, the hold step ST03 and the counting step ST02 are repeated according to the flowchart of FIG. 3. Reading the digital value upon the completion of the counting step ST02 completes the AD conversion operation.

Advantage of Third Embodiment

As described above, according to the third embodiment, even when each of the column ADCs 500 includes a plurality of latch circuits to address repeated counting operations, and also includes the U/D counter 540 to repeat a count-up or count-down operation, the circuit area can be reduced as compared to conventional solid-state imaging devices. That is, repetition of a count-up or count-down operation M times (M is a positive integer) allows the circuit area to be reduced to 2/M. Note that, as the number of repetitions increases, the number of latches can be significantly reduced as compared to conventional solid-state imaging devices.

In particular, in a case of performing so-called correlated double sampling (CDS), in which a reset level read from a pixel is subtracted from the signal level read from that pixel as an offset, a single AD conversion operation of a pixel signal corresponds to M=2; when an ADC performs a pixel addition operation of two rows, M takes 4. In such a case, this embodiment enables the number of the latch circuits to be halved, and at the same time enables the bit accuracy of an AD conversion operation to be increased as compared to conventional solid-state imaging devices. Similarly, when an ADC performs a pixel addition operation of N rows, M takes 2N. In such a case, this embodiment enables the number of the latch circuits to be reduced to 1/N as compared to conventional solid-state imaging devices, and at the same time enables the bit accuracy of an AD conversion operation to be increased as much as conventional solid-state imaging devices.

First Variation of Third Embodiment

Figure 29:
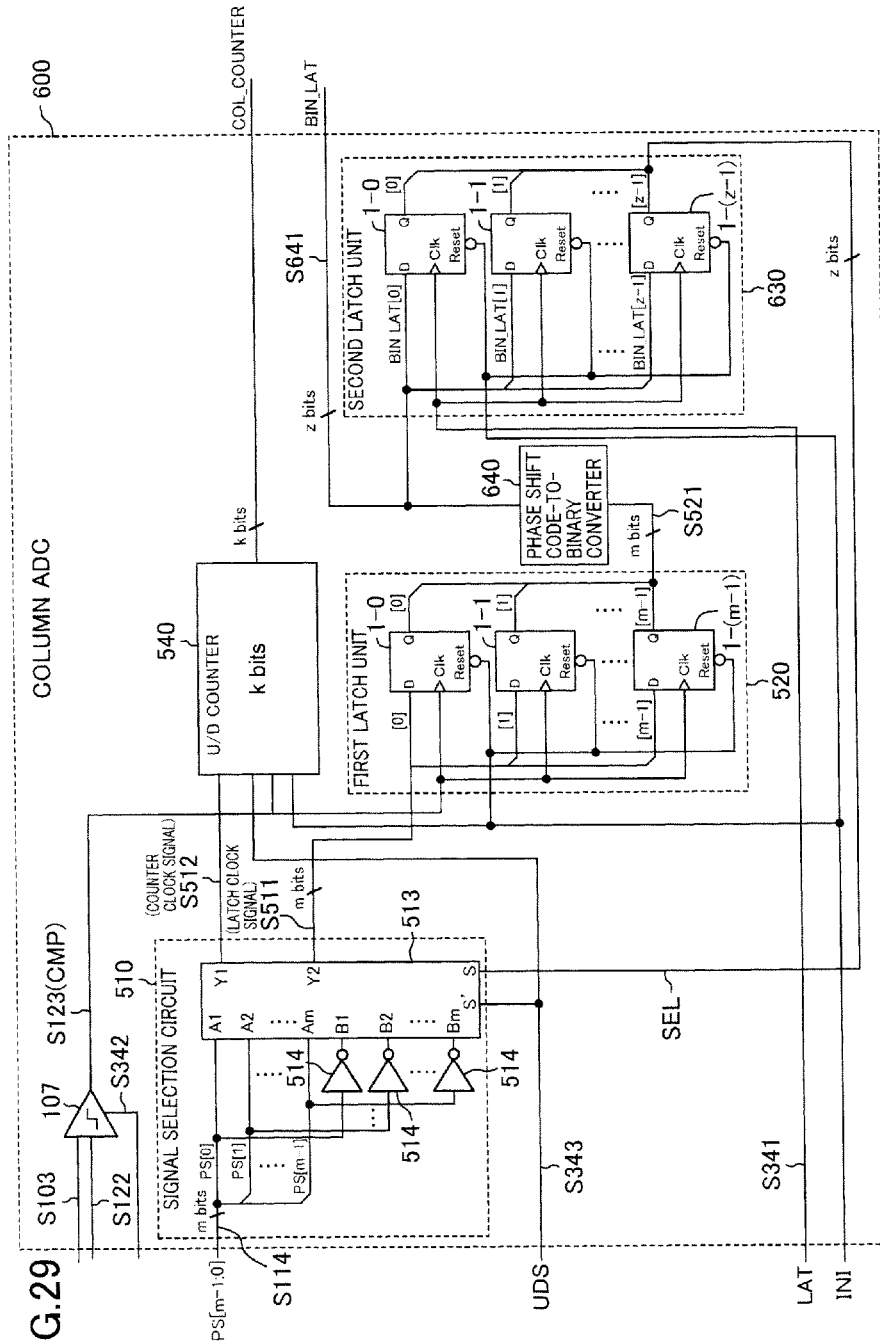
FIG. 29 is a block diagram illustrating a configuration of the column ADCs according to a first variation of the third embodiment.

FIG. 29 is a block diagram illustrating a configuration of the column ADCs 600 according to a first variation of the third embodiment. As shown in FIG. 29, each of the column ADCs 600 differs from the column ADC 500 of the third embodiment in the phase shift code-to-binary converter 640 and in the second latch unit 630. The phase shift code-to-binary converter 560 provided in the second embodiment is no longer included.

The phase shift code-to-binary converter 640 converts the m-bit width output signal (latch output signal S521) of the first latch unit 520 into a z-bit width binary signal S641 (BIN_LAT) (where z is a value as expressed by the equation $m=2^{(z-1)}$), and outputs the binary signal S641 to both the second latch unit 630 and the output signal bus 127.

The second latch unit 630 is a z-bit latch circuit, and includes z of the one-bit latch circuits 1 therein. In FIG. 29, sub-numerals (-0, -1, . . . , and -(z–1)) are respectively added to the reference numerals of the latch circuits. The second latch unit 630 stores the z-bit binary signal S641 based on the latch control clock signal S341. The binary signal S641 stored in the second latch unit 630 is input to the switch terminal S of the selector 513 as the selection signal SEL. When the configuration of FIG. 29 is used, the switch terminal S of the selector 513 receives a binary value converted from a phase shift code, which only requires the configuration of the selector 513 to be converted so that the selection logic targets binary values instead of phase shift code values.

Such a configuration allows the width of the output bus coupled to the second latch unit 630 to be reduced from m bits to z bits (the relationship $m=2^{(z-1)}$ indicates that m≥z). Moreover, the phase shift code-to-binary converter 560 needed in the second embodiment is no longer required.

Second Variation of Third Embodiment

Figure 30:
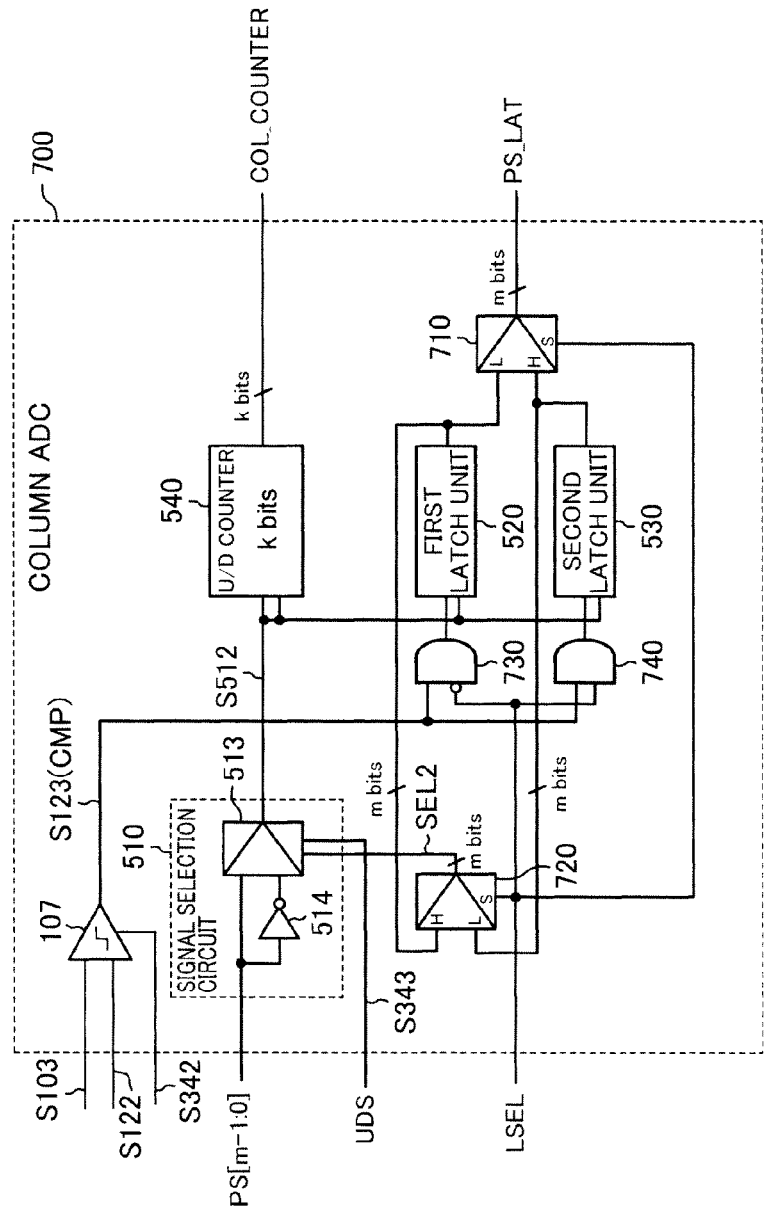
FIG. 30 is a block diagram illustrating a configuration of the column ADCs according to a second variation of the third embodiment.

FIG. 30 is a block diagram illustrating a configuration of the column ADCs 700 according to a second variation of the third embodiment. As shown in FIG. 30, each of the column ADCs 700 further includes selectors 710 and 720 and logic elements 730 and 740 in addition to the components of the column ADC 500 of the third embodiment.

The selectors 710 and 720 both receive the output (latch output signal S521) of the first latch unit 520 and the output (selection signal SEL) of the second latch unit 530, and selectively output one of the two signals input (S521 or SEL) based on a selection signal LSEL received. More specifically, if the selector 710 selects the output of the first latch unit 520, the selector 720 selects the output of the second latch unit 530; conversely, if the selector 710 selects the output of the second latch unit 530, the selector 720 selects the output of the first latch unit 520. Here, the selection signal LSEL is generated by the timing signal generator 340. The selection signal LSEL remains constant during the counting step ST02, and is inverted during the hold step ST03.

The logic elements 730 and 740 both receive the selection signal LSEL and the output (comparison result signal S123) of the comparator 107. The logic element 740 is an AND circuit, and the element 730 is an AND circuit having a NOT circuit at the input of the selection signal LSEL.

Operation of Second Variation

Due to the selection signal LSEL supplied from the timing signal generator 340, the column ADC 700 can select either the first latch unit 520 or the second latch unit 530 as the latch circuit to store the latch clock signal S511 (phase shift code signal) when the output signal of the comparator 107 is inverted during a counting step ST02. In addition, if the first latch unit 520 is selected (the selection signal LSEL is a logical 0), the selection signal SEL2 input to the signal selection circuit 510 has the value stored in the second latch unit 530. Conversely, if the second latch unit 530 is selected (the selection signal LSEL is a logical 1), the selection signal SEL2 input to the signal selection circuit 510 can be set to the value stored in the first latch unit 520.

That is, by allowing the selection signal LSEL to toggle at each hold step ST03, if the latch clock signal (phase shift code signal S511) is stored in the first latch unit 520 during a counting step ST02, then the signal selection circuit 510 can select the latch clock signal based on the value of the first latch unit 520 which stores the value of the latch clock signal when the output of the comparator 107 is inverted during the previous counting step ST02. In contrast, if the latch clock signal is stored in the second latch unit 530, the signal selection circuit 510 can select the latch clock signal based on the value of the second latch unit 530 which stores the value of the latch clock signal when the output of the comparator 107 is inverted during the previous counting step ST02. Such a process allows also this variation to provide similar advantages to those of the solid-state imaging device 3000 of the third embodiment.

Note that, in the first counting step ST02, both the first and second latch units 520 and 530 each have an initial value of zero because both the first and second latch units 520 and 530 are initialized in the initialization step ST01. Thus, irrespective of which of the first latch unit 520 or the second latch unit 530 is selected, a same value is input to the switch terminal S of the signal selection circuit 510 as the selection signal SEL2, thereby causing the signal selection circuit 510 to select the same clock signals as the column ADC 500 of the third embodiment. Thus, the column ADC 700 operates similarly to the column ADC 500.

Other Embodiments

The first, second, and third embodiments, and the variations thereof should not be construed as limiting the arrangement of the pixels. Various arrangements may be used such as back-illuminated structures, organic photoelectric conversion films, and configurations having increased pixel sizes. If the pixels are arranged so that the light use efficiency in the pixels 101 (sensing elements) is improved, such as implemented in back-illuminated structures, organic photoelectric conversion films, and configurations having increased pixel sizes, then the magnitude of the read signal (analog signal) from each pixel 101 is increased, thereby eventually causing the time needed for AD conversion to increase. Each of the embodiments and the variations thereof described above enables the bit accuracy after AD conversion to be improved while maintaining the time needed for AD conversion, and thus is expected to provide significant advantages in such arrangements of pixels.

Although the optical system 900 of each of the embodiments and the variations thereof described above has been described as including a mechanical shutter, the advantages of the present invention is not affected even if the mechanical shutter is not included.

It should be understood that the pixel 101 is merely an example of sensing elements, and may not only be a device for measuring the physical quantities with respect to visible rays as described above, but also be a device for measuring the physical quantities with respect to electromagnetic waves, alpha rays, beta rays, etc.

The present invention provides advantages in that even when the number of pixels, the frame rate, the conversion bit width, etc. are increased, high image quality and high-speed processing can be achieved while preventing an increase in circuit size. Thus, the present invention is useful for solid-state imaging devices, imaging systems, etc., having sensing elements for measuring physical quantities with respect to visible rays, electromagnetic waves, alpha rays, beta rays, etc.

What is claimed is:

1. A solid-state imaging device which includes a plurality of sensing elements arranged in a matrix format for measuring physical quantities, and a plurality of column analog-to-digital conversion circuits (ADCs) for converting signals output from the sensing elements into digital signals, each of the column ADCs comprising:
   a comparator configured to output a comparison result signal which indicates a result of voltage comparison between a voltage of a signal output from the sensing elements and an analog ramp voltage generated from a reference clock signal;
   a column counter configured to count a column counter clock signal, which is either the reference clock signal or a phase-shifted reference clock signal, and to store a value represented by upper bits of a count value at a time of change in the comparison result signal;
   a first latch unit configured to store a latch clock signal which represents a value represented by lower bits of the count value; and
   a second latch unit configured to store a value corresponding to the value stored in the first latch unit.

2. The solid-state imaging device of claim 1, comprising:
   a signal selection circuit configured to output either the reference clock signal or an inverted signal of the reference clock signal as the column counter clock signal based on the value stored in the second latch unit.

3. The solid-state imaging device of claim 2, wherein an operation setting of the column counter can be switched between an up-count mode and a down-count mode.

4. The solid-state imaging device of claim 1, comprising:
   a phase shift code generator configured to generate (m−1) (m is a natural number greater than or equal to two) clock signals sequentially phase-shifted by $\pi/m$ relative to the reference clock signal, and to output both the (m−1) clock signals and the reference clock signal together as a phase shift code; and
   a signal selection circuit configured to select predetermined bits of the phase shift code based on the value stored in the second latch unit, and to output the selected bits as the column counter clock signal and the latch clock signal.

5. The solid-state imaging device of claim 4, comprising:
   a converter configured to convert the phase shift code stored in the first latch unit into a binary value of lower bits of the count value.

6. The solid-state imaging device of claim 5, wherein the second latch unit stores an output of the converter.

7. The solid-state imaging device of claim 4, wherein the first latch unit is an m-bit latch circuit, and
   the phase shift code represents lower bits, of the count value, which are z-bit width (where z is a value as expressed by the equation $m=2^{(z-1)}$).

8. The solid-state imaging device of claim 4, wherein an operation setting of the column counter can be switched between an up-count mode and a down-count mode.

9. The solid-state imaging device of claim 4, wherein the signal selection circuit selects the bits of the phase shift code so that the latch clock signal and a counter clock signal are respectively in the phase states at the time of change in the comparison result signal.

10. The solid-state imaging device of claim 1, comprising:
    a selector configured to switch an input-output relationship between the first and second latch units.

11. An imaging system, comprising:
    the solid-state imaging device of claim 1;
    a clock generator configured to generate the reference clock signal; and
    an image signal processor configured to perform image processing on an output signal of the solid-state imaging device.

12. A method for driving a solid-state imaging device which includes a plurality of sensing elements arranged in a matrix format for measuring physical quantities, and a plurality of column analog-to-digital conversion circuits (ADCs) for converting signals output from the sensing elements into digital signals, comprising:
    outputting a comparison result signal which indicates a result of voltage comparison between a voltage of a signal output from the sensing elements and an analog ramp voltage generated from a count value of a reference clock signal;
    counting a column counter clock signal, which is either the reference clock signal or a phase-shifted reference clock signal, and storing a value represented by upper bits of the count value at a time of change in the comparison result signal;
    first storing a latch clock signal which represents a value represented by lower bits of the count value; and
    second storing a value corresponding to the value stored by the first storing.

* * * * *